United States Patent
Oda et al.

(10) Patent No.: US 9,640,557 B2
(45) Date of Patent: May 2, 2017

(54) TFT ARRAY SUBSTRATE AND METHOD FOR PRODUCING THE SAME

(71) Applicant: Mitsubishi Electric Corporation, Tokyo (JP)

(72) Inventors: Koji Oda, Kumamoto (JP); Kazunori Inoue, Kumamoto (JP); Nobuaki Ishiga, Kumamoto (JP); Osamu Miyakawa, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/222,503

(22) Filed: Mar. 21, 2014

(65) Prior Publication Data

US 2014/0299881 A1    Oct. 9, 2014

(30) Foreign Application Priority Data

Apr. 3, 2013    (JP) .................................. 2013-077357

(51) Int. Cl.
    *H01L 27/12*    (2006.01)
(52) U.S. Cl.
    CPC .................................. *H01L 27/124* (2013.01)
(58) Field of Classification Search
    CPC combination set(s) only.
    See application file for complete search history.

(56) References Cited

U.S. PATENT DOCUMENTS

| | | |
|---|---|---|
| 6,678,017 B1 | 1/2004 | Shimomaki et al. |
| 7,224,032 B2 | 5/2007 | Shiraki et al. |
| 7,791,695 B2 | 9/2010 | Toyota et al. |
| 7,952,671 B2 | 5/2011 | Aota et al. |
| 8,023,088 B2 | 9/2011 | Nakao |

(Continued)

FOREIGN PATENT DOCUMENTS

| | | |
|---|---|---|
| CN | 1651998 A | 8/2005 |
| CN | 101424853 A | 5/2009 |

(Continued)

OTHER PUBLICATIONS

First Office Action issued by the Chinese Patent Office on May 11, 2016, which corresponds to Chinese Patent Application No. 201410131136.6 and is related to U.S. Appl. No. 14/222,503; with English language translation.

(Continued)

*Primary Examiner* — Fernando L Toledo
*Assistant Examiner* — Lawrence-Linh T Nguyen
(74) *Attorney, Agent, or Firm* — Studebaker & Brackett PC

(57) ABSTRACT

A TFT array substrate has an organic insulating film formed of a photosensitive organic resin material. A common electrode and a lead-out wiring are formed on the organic insulating film, and a pixel electrode is formed above the common electrode with an interlayer insulating film provided between them. The pixel electrode is connected to the lead-out wiring through a contact hole formed in the interlayer insulating film. The lead-out wiring and the common electrode are connected to a drain electrode and a common wiring, respectively, through contact holes formed in the organic insulating film. A metal cap film is provided on each of the lead-out wiring and the common electrode in the contact holes formed in the organic insulating film.

3 Claims, 21 Drawing Sheets

(56) References Cited

U.S. PATENT DOCUMENTS

| | | | |
|---|---|---|---|
| 2005/0173707 A1 | 8/2005 | Shiraki et al. | |
| 2006/0268210 A1* | 11/2006 | Denda | G02F 1/13439 349/139 |
| 2007/0069211 A1* | 3/2007 | Inoue | G02F 1/1341 257/59 |
| 2007/0171319 A1 | 7/2007 | Fujita et al. | |
| 2007/0210353 A1* | 9/2007 | Nagata | H01L 29/4908 257/288 |
| 2009/0115950 A1 | 5/2009 | Toyota et al. | |
| 2010/0079713 A1* | 4/2010 | Asuma | G02F 1/136227 349/139 |
| 2010/0289997 A1 | 11/2010 | Suzuki et al. | |

FOREIGN PATENT DOCUMENTS

| | | |
|---|---|---|
| CN | 101919043 A | 12/2010 |
| JP | 2007-226175 A | 9/2007 |
| JP | 2008-165134 A | 7/2008 |
| JP | 2009-031468 A | 2/2009 |
| JP | 2009-036947 A | 2/2009 |
| JP | 2009-133954 A | 6/2009 |
| KR | 2007-0029981 A | 3/2007 |
| KR | 10-1216171 B1 | 12/2012 |

OTHER PUBLICATIONS

An Office Action issued by the Chinese Patent Office on Dec. 14, 2016, which corresponds to Chinese Patent Application No. 201410131136.6 and is related to U.S. Appl. No. 14/222,503; with English language partial translation.

* cited by examiner

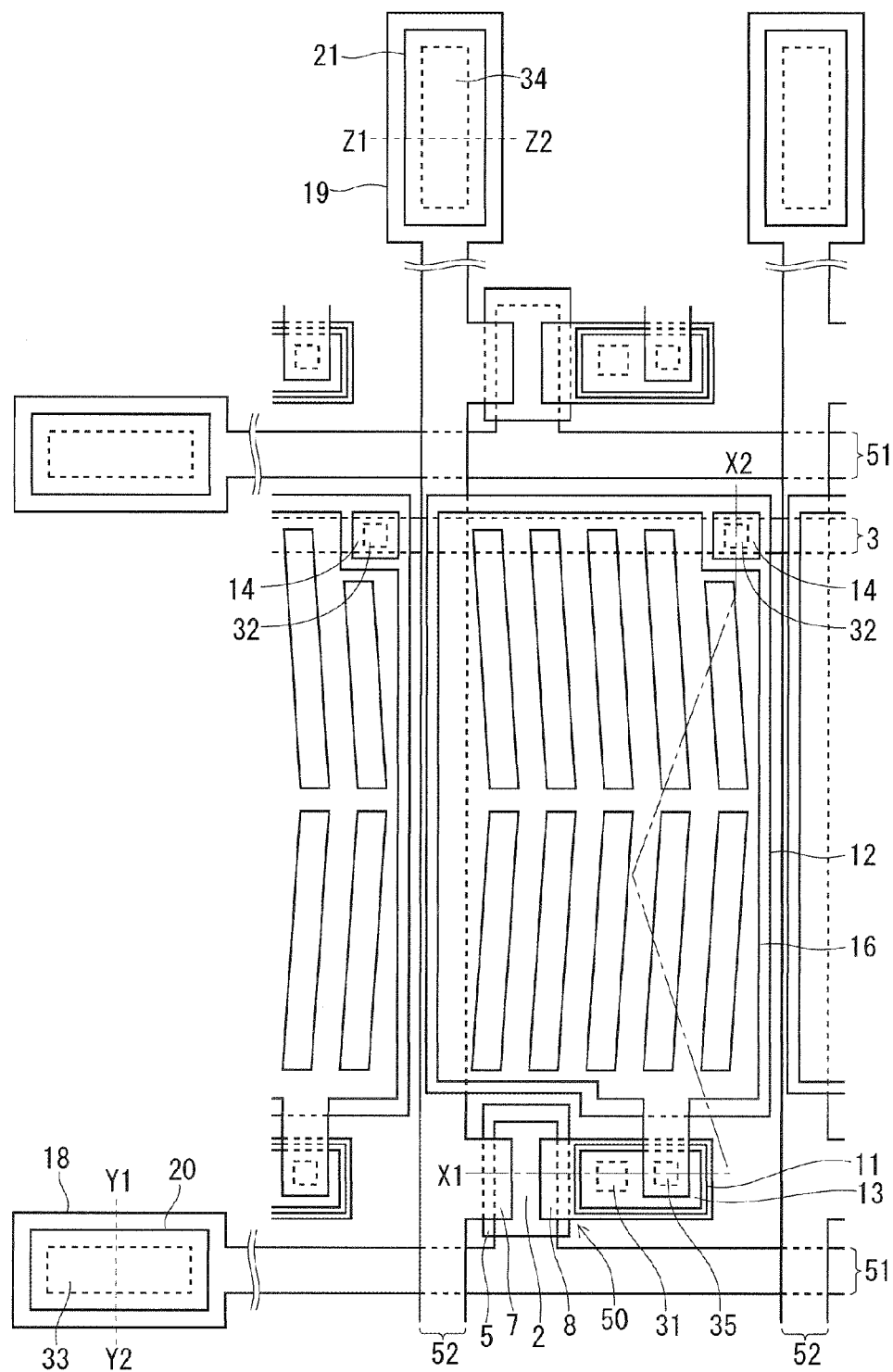
F I G . 1

F I G . 3
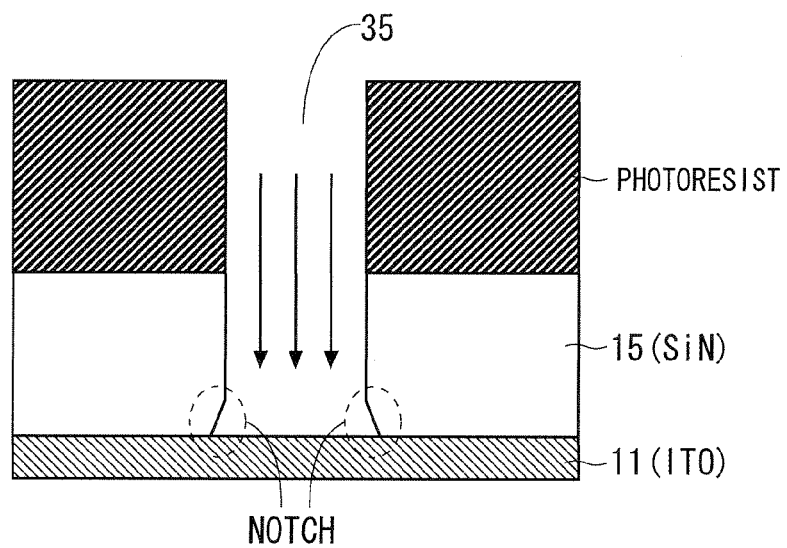
F I G . 4
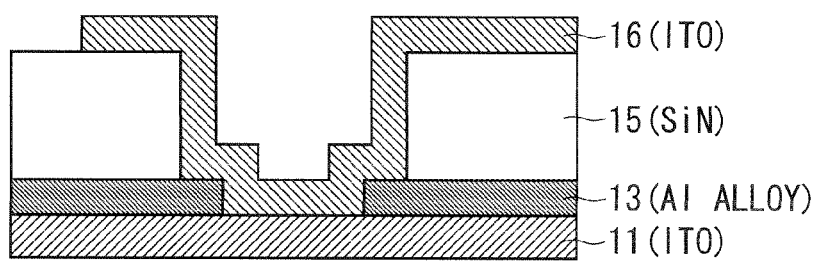

TFT ARRAY SUBSTRATE AND METHOD FOR PRODUCING THE SAME

BACKGROUND OF THE INVENTION

Field of the Invention

The present invention relates to a thin film transistor (TFT) array substrate and a liquid crystal display device including the same, and more particularly, to a fringe field switching (FFS) mode thin film transistor array substrate in which a pixel electrode and a common electrode are arranged on a planarizing insulating film so as to be opposed to each other through an insulating film, and a liquid crystal display device including the same.

Description of the Background Art

In general, a display mode of the liquid crystal display device is broadly classified into a twisted nematic (TN) mode, and a lateral electric field mode represented by in-plane switching (IPS) mode or a fringe field switching (FFS) mode. The liquid crystal display device of the lateral electric field mode is wide in viewing angle and high in contrast.

According to the liquid crystal display device of the IPS mode, display is implemented by applying a lateral electric field to liquid crystal sandwiched between opposed substrates, but since a pixel electrode and a common electrode to apply the lateral electric field are provided in the same layer, liquid crystal molecules positioned just above the pixel electrode cannot be sufficiently driven, so that its transmittance is low in this case.

Meanwhile, according to the FFS mode, since the common electrode and the pixel electrode are arranged through an interlayer insulating film, an oblique electric field (fringe electric field) is generated, so that the lateral electric field can be applied to liquid crystal molecules provided just above the pixel electrode, and can sufficiently drive them. Therefore, its viewing angle is wide, and its transmittance is higher than that of the IPS mode.

Recently, due to demands for further low power consumption and high aperture ratio, a structure of a FFS mode thin film transistor (TFT) array substrate including a thick planarizing insulating film has been proposed (Japanese Patent Application Laid-Open No. 2009-133954 and Japanese Patent Application Laid-Open No. 2007-226175, for example). When the thick planarizing insulating film is formed on a common wiring, a source wiring, and a TFT element, parasitic capacity of each signal line can be reduced, and power consumption can be low. In addition, since an upper surface of the TFT array substrate can be planarized by eliminating a difference in level among the wirings, a disorder in liquid crystal orientation conventionally generated in the level-difference part can be eliminated, and an area which does not contribute to the display is reduced, so that the aperture ratio is improved. Furthermore, since the pixel electrode is kept away from the signal line, the pixel electrode is not affected by the electric field generated from the signal line, so that it can be formed so as to overlap with the signal line. As a result, the pixel electrode can be enlarged.

According to a FFS mode liquid crystal device, liquid crystal is driven with a fringe electric field generated between a pixel electrode (or an opposed electrode) having slits provided in an upper layer, and the opposed electrode (or the pixel electrode) arranged under the pixel electrode through an insulating film. The pixel electrode and the opposed electrode are formed of a transparent conductive film composed of ITO or IZO, to prevent a pixel aperture ratio from becoming low. In addition, since holding capacitor is formed with the pixel electrode and the opposed electrode, it is not necessary to separately form holding capacitor in the pixel, unlike the TN mode liquid crystal device. In addition, as the interlayer insulating film provided between the pixel electrode and the opposed electrode becomes thin, electric field intensity becomes high, so that the liquid crystal can be driven at low voltage. For example, it is supposed that the thickness of the interlayer insulating film is preferably thinned to 200 nm to 400 nm.

However, regarding the above TFT array substrate including the thick planarizing insulating film, since a contact hole is deep, a new problem arises. As shown in FIG. 7 in the Japanese Patent Application Laid-Open Nos. 2009-133954 and 2007-226175, the pixel electrode and the common electrode need to be electrically connected to the drain electrode of the TFT and the common wiring through the contact holes. In a case where the planarizing insulating film is formed of a photosensitive resin or the like, an aspect ratio of the contact hole is high, so that the interlayer insulating film is not likely to be uniformly formed in the contact hole. In addition, as the interlayer insulating film becomes thin, a covering defect such as a pinhole is likely to be generated in a bottom and a slope part of the contact hole. When the pinhole is generated in the interlayer insulating film, an etching solution used when the upper transparent conductive film is processed passes through the pinhole and dissolves the lower transparent conductive film, which causes a connection defect and a resistance increase.

With respect to the above problem, Japanese Patent Application Laid-Open No. 2008-165134, for example, discloses a structure in which an inside of a contact hole is covered with a part of an upper layer electrode which is electrically isolated. However, this is not satisfactory in view of a problem in alignment accuracy in photoengraving process caused when a glass substrate is big, or a case where an etching residue is generated in an isolated part.

In addition, Japanese Patent Application Laid-Open No. 2009-036947, for example, discloses that an insulating film composed of a liquid material is formed in a contact hole to fill it. However, in order to completely fill the contact hole, a substantial amount of the liquid material needs to be applied to a substrate surface, and as a result, the insulating film is left between the pixel electrode and the opposed electrode, so that it is extremely difficult to reduce only the thickness of the insulating film between the pixel electrode and the opposed electrode. In addition, the liquid material is low in permittivity and a fringe electric field becomes weak, which is not preferable. Furthermore, the liquid material is high in cost.

In addition, the FFS structure including the planarizing insulating film has the problem that a large number of masks are needed in its producing process and production cost becomes high. For example, in a case where a TFT array substrate including a TFT element having a top gate structure is formed, nine photoengraving (photolithography) steps are needed in (1) patterning a light blocking electrode, (2) patterning a semiconductor layer, (3) patterning source/drain electrodes, (4) patterning a gate electrode, (5) forming a contact hole in a protective insulating film, (6) forming a contact hole in a planarizing insulating film, (7) patterning a lower layer electrode, (8) forming a contact hole in an interlayer insulating film, and (9) patterning an upper layer electrode. When the planarizing insulating film having the contact hole is used as a mask, (5) and (6) can be collectively performed, but still eight photoengraving steps are needed.

SUMMARY OF THE INVENTION

A first object of the present invention is to provide a TFT array substrate capable of preventing an interconnection defect or a resistance increase in a contact hole, in a liquid crystal display device having a structure in which a common electrode and a pixel electrode are arranged on a planarizing insulating film. In addition, a second object of the present invention is to provide a method for producing a TFT array substrate capable of reducing the number of masks required for producing the TFT array substrate.

A TFT array substrate according to the present invention includes a TFT element, a common wiring supplied with a common potential, and an organic insulating film formed of a photosensitive organic resin material to cover a drain electrode of the TFT element and the common wiring. A first contact hole reaching the drain electrode and a second contact hole reaching the common wiring are formed in the organic insulating film. A first electrode and a lead-out wiring extend on the organic insulating film. A second electrode extends above the first electrode through an interlayer insulating film. The second electrode is connected to the lead-out wiring through a third contact hole formed in the interlayer insulating film. One of the first electrode and the lead-out wiring is connected to the drain electrode through the first contact hole. The other of the first electrode and the lead-out wiring is connected to the common wiring through the second contact hole. A metal cap film is formed on each of the first electrode and the lead-out wiring in the first contact hole and the second contact hole.

A first aspect of a method for producing a TFT array substrate according to the present invention includes following steps (a) to (j). The step (a) is a step of forming a light blocking film and a common wiring on a substrate. The step (b) is a step of forming an insulating film to cover the light blocking film and the common wiring. The step (c) is a step of forming a semiconductor layer of a TFT element above the light blocking film, and forming a source electrode and a drain electrode of the TFT element on the semiconductor layer. The step of (d) is a step of forming a gate insulating film on a whole upper surface of the substrate, after the step (c). The step (e) is a step of applying a photosensitive organic resin material on a whole upper surface of the substrate, and exposing and developing the material by a halftone method to remove the organic resin material on the drain electrode and on the common wiring, and form the thin organic resin material on a formation region of the TFT element, after the step (d). The step (f) is a step of removing the insulating film and the gate insulating film on the drain electrode and the common wiring with the organic resin material used as a mask to form a contact hole. The step (g) is a step of removing the thin organic resin material by thinning the organic resin material by ashing, and then sequentially forming a transparent conductive film, and a metal film on the organic resin material. The step (h) is a step of applying a photoresist on the metal film, and exposing and developing the photoresist by a halftone method to form a resist having patterns of a gate electrode of the TFT element, a lead-out wiring, and a common electrode, and form a thin resist in a region of the common electrode except for an inside the contact hole. The step (i) is a step of forming the gate electrode, the lead-out wiring, and the common electrode at the same time by etching the metal film and the transparent conductive film with the resist used as a mask.

The step (j) is a step of removing the thin resist by thinning the resist by ashing, and removing the metal film on the common electrode except for the inside of the contact hole by etching the metal film.

A second aspect of a method for producing a TFT array substrate according to the present invention includes following steps (a) to (d). The step (a) is a step of sequentially forming an oxide semiconductor and a first metal film on a substrate. The step (b) is a step of applying a photoresist on the first metal film, and exposing and developing the photoresist by a halftone method to form a resist having patterns of a source electrode and a drain electrode of a TFT element, and a common wiring, and form a thin resist on a region corresponding to a channel region of the TFT element. The step (c) is a step of forming the source electrode, the drain electrode, and the common wiring at the same time by etching the first metal film and the oxide semiconductor with the resist used as a mask. The step (d) is a step of removing the thin resist by thinning the resist by ashing, and removing the first metal film on the channel region of the TFT element by etching the first metal film with the resist used as a mask.

According to the TFT array substrate in the present invention, the metal cap film is provided on each of the first electrode and the lead-out wiring in the first and second contact holes. Therefore, an etching solution used when the second electrode is patterned is prevented from passing through the pinhole in the interlayer insulating film and reaching the first electrode and the lead-out wiring. Thus, the first electrode and the lead-out wiring can be prevented from being eroded, and contact resistance can be prevented from being increased and a contact defect can be prevented from being generated. In addition, there is another advantage that mechanical strength can be ensured due to the metal cap film in a case where the first electrode is thinned to increase transmittance. Because the lead-out wiring 11 is formed, an alignment defect can be prevented from being generated between the first or second contact hole and the third contact hole.

In addition, according to the method for producing the TFT array substrate in the present invention, the electrodes and the wiring in the TFT array substrate in the present invention can be collectively formed by the halftone method, so that the number of photoengraving steps can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing a configuration of a TFT array substrate according to a first preferred embodiment;

FIG. 3 is a view for describing an effect of the first preferred embodiment;

FIGS. 4 and 5 are views each showing a variation of the TFT array substrate according to the first preferred embodiment;

DESCRIPTION OF THE PREFERRED EMBODIMENTS

First Preferred Embodiment

The present invention relates to a FFS mode liquid crystal display device in which liquid crystal is held between a TFT array substrate and an opposed substrate, and the TFT array substrate has a characteristic structure. This preferred embodiment shows a case where the present invention is applied to a TFT array substrate provided with an inversely-staggered TFT.

Figure 2:
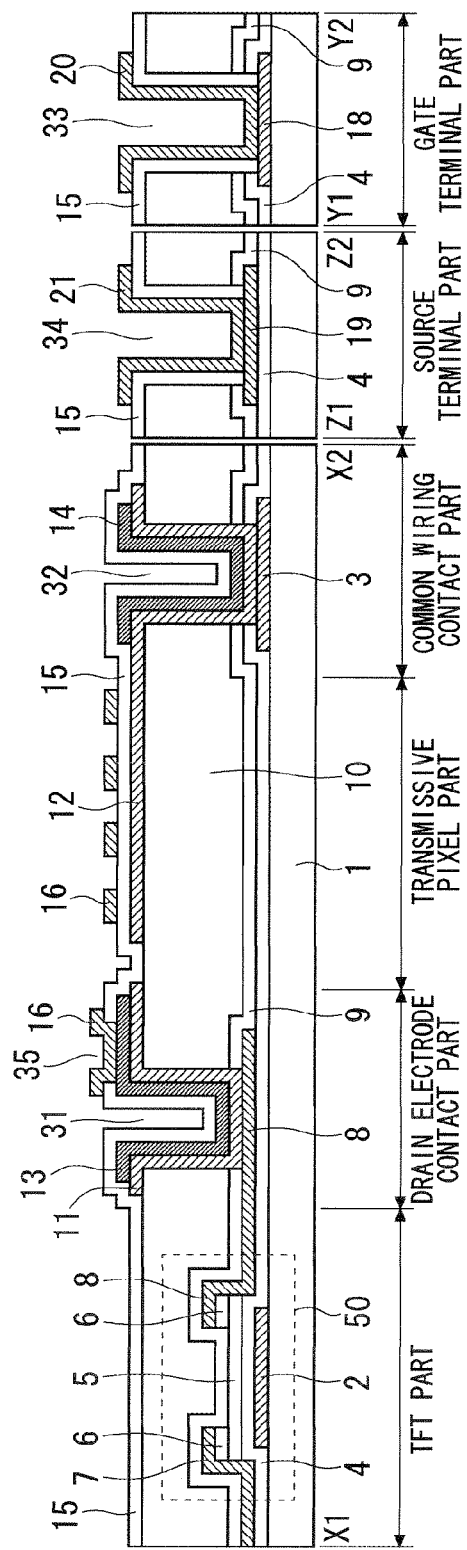
FIG. 2 is a cross-sectional view showing the configuration of the TFT array substrate according to the first preferred embodiment.

FIG. 1 is a plan view showing a configuration of a TFT array substrate according to a first preferred embodiment. In addition, FIG. 2 shows cross-sectional views of the TFT array substrate, corresponding to cross-sectional surfaces taken along lines X1-X2, Y1-Y2, and Z1-Z2 in FIG. 1.

In addition, in the cross-sectional surface taken along the line X1-X2 in FIG. 2, a "TFT part" shows a region where a TFT element 50 which will be described below is formed, a "drain electrode contact part" shows a region where a drain electrode contact hole 31 which will be described below is formed, a "transmissive pixel part" shows a region where a pixel electrode 16 and a common electrode 12 which will be described below are formed, and a "common wiring contact part" shows a region where a common wiring contact hole 32 which will be described below is formed. In addition, in the cross-sectional surface taken along the line Y1-Y2, a "gate terminal part" shows a region where a gate terminal electrode 18 and a gate terminal pad 20 which will be described below are formed, and in the cross-sectional surface taken along the line Z1-Z2, a "source terminal part" show a region where a source terminal electrode 19 and a source terminal pad 21 which will be described below are formed.

As shown in FIG. 1, a plurality of gate wirings 51 and a plurality of source wirings 52 are arranged on the TFT array substrate so as to intersect with each other, and the TFT element 50 is arranged in the vicinity of their intersection point. The gate terminal electrode 18 is formed in one end of the gate wiring 51, and the gate terminal pad 20 is formed on the gate terminal electrode 18 and connected to the gate terminal electrode 18 through a contact hole 33 (hereinafter, referred to as the "gate terminal contact hole"). In addition, the source terminal electrode 19 is formed in one end of the source wiring 52, and the source terminal pad 21 is formed on the source terminal electrode 19 and connected to the source terminal electrode 19 through a contact hole 34 (hereinafter, referred to as the "source terminal contact hole").

A gate electrode 2 of the TFT element 50 is connected to the gate wiring 51. That is, a part branching off from the gate wiring 51 and extending toward the region where the TFT element 50 is formed (TFT part) serves as the gate electrode 2 of the TFT element 50. In addition, a common wiring 3 supplied with a common potential is formed of the same layer as that of the gate electrode 2.

In addition, a source electrode 7 of the TFT element 50 is connected to the source wiring 52. That is, a part branching off from the source wiring 52 and extending toward the region where the TFT element 50 is formed serves as the source electrode 7 of the TFT element 50. In addition, a drain electrode 8 of the TFT element 50 is formed of the same layer as that of the source wiring 52.

As shown in FIG. 2, the gate electrode 2 of the TFT element 50 is formed on a transparent insulating substrate 1 made of glass. In addition, a semiconductor layer 5 is formed on a gate insulating film 4 provided on the gate electrode 2. The source electrode 7 and the drain electrode 8 are formed on the semiconductor layer 5 with an ohmic contact layer 6 provided between them. The source electrode 7 and the drain electrode 8 are separately arranged so as to be opposed to each other, and an exposed part of the semiconductor layer 5 provided between them serves as a channel region of the TFT element 50.

The TFT element 50, the gate wiring 51, and the source wiring 52 are covered with a protective insulating film 9, and covered again with a flat organic insulating film 10 (planarizing insulating film). The flat-plate common electrode 12 is formed on the organic insulating film 10, and the comb-shaped pixel electrode 16 having slits is formed on an interlayer insulating film 15 provided on the common electrode 12. As shown in FIG. 1, the common electrode 12 and the pixel electrode 16 are arranged so as to cover almost a whole pixel region surrounded by the two gate wirings 51 and the two source wirings 52.

The protective insulating film 9 and the organic insulating film 10 have the gate terminal contact hole 33 and the source terminal contact hole 34, and in addition, the contact hole 31 reaching the drain electrode 8 (hereinafter, referred to as the "drain electrode contact hole") and the contact hole 32 reaching the common wiring 3 (hereinafter, referred to as the "common wiring contact hole").

On the organic insulating film 10 including an inside of the drain electrode contact hole 31, a lead-out wiring 11 to connect the pixel electrode 16 to the drain electrode 8 is formed of the same layer as that of the common electrode 12. In addition, as shown in FIG. 2, a metal cap film 13 is provided on the lead-out wiring 11. The metal cap film 13 is formed in the drain electrode contact hole 31, and also formed on the lead-out wiring 11 provided outside the drain electrode contact hole 31. That is, the metal cap film 13 partially overlaps with the drain electrode contact hole 31 in planar view, and in addition, it extends over the organic insulating film 10.

While the lead-out wiring 11 and the metal cap film 13 are covered with an interlayer insulating film 15, a contact hole 35 (hereinafter, referred to as the "lead-out wiring contact hole") is formed in the interlayer insulating film 15 so as to reach the metal cap film 13 on the lead-out wiring 11, so that the pixel electrode 16 is connected to the metal cap film 13 through the lead-out wiring contact hole 35. As a result, the pixel electrode 16 is electrically connected to the lead-out wiring 11 and the drain electrode 8.

The common electrode 12 is connected to the common wiring 3 through the common wiring contact hole 32. As shown in FIG. 2, a metal cap film 14 is provided at least on the common electrode 12 in the common wiring contact hole 32. That is, the metal cap film 14 overlaps with the common wiring contact hole 32 in planar view.

In addition, the gate terminal pad 20 connected to the gate terminal electrode 18 through the gate terminal contact hole 33, and the source terminal pad 21 connected to the source terminal electrode 19 through the source terminal contact hole 34 are formed of the same layer as that of the pixel electrode 16.

A method for producing the TFT array substrate shown in FIGS. 1 and 2 will be now described.

First, an Al alloy (such as Al—Ni—Nd) film is formed on the transparent insulating substrate 1 made of glass to be 200 nm to 300 nm in thickness by DC magnetron sputtering. Then, the Al alloy film is patterned by photoengraving and wet etching with a photoresist to form the gate wiring 51, the gate electrode 2, the common wiring 3, and the gate terminal electrode 18. At the time of etching of the Al alloy, a PAN series etching solution (mixed acid of phosphoric acid, nitric acid, and acetic acid) is used.

The Al alloy is used herein as the material of the gate wiring 51, the gate electrode 2, and the like, but another material may be used as long as wiring resistance is sufficiently low. The Al—Ni—Nd alloy is high in conductivity because its main component is Al, and it can be electrically connected to a transparent conductive film composed of ITO or the like because of the added Ni.

Then, a silicon nitride film serving as the gate insulating film 4 is formed by plasma chemical vapor deposition (CVD) so as to cover a whole upper surface of the transparent insulating substrate 1. An intrinsic amorphous silicon film serving as the semiconductor layer 5, and a phosphor-doped n-type amorphous silicon film serving as the ohmic contact layer 6 are sequentially formed on the gate insulating film 4 by plasma CVD. Then, they are patterned by photoengraving and dry etching with a photoresist, whereby island patterns of the semiconductor layer 5 and the ohmic contact layer 6 are formed in the region where the TFT element 50 is formed.

Then, a metal film composed of an Mo alloy, chrome, or an Al alloy (such as Al-Mi-Nd) is formed by DC magnetron sputtering. In this case, the metal film has a laminated structure in which a MoNb alloy and an Al—Ni—Nd alloy each having a thickness of 100 nm are laminated.

Then, the metal film is patterned by photoengraving and wet etching with a photoresist, whereby the source wiring 52, the source electrode 7, and the drain electrode 8 are formed. At this time, the n-type amorphous silicon film (ohmic contact layer 6) provided between the source electrode 7 and the drain electrode 8 is removed by dry etching using the same photoresist pattern as that of the wet etching, and the surface of the semiconductor layer 5 (channel region) is exposed.

Then, the protective insulating film 9 is formed so as to cover the whole upper surface of the transparent insulating substrate 1. In this case, as the protective insulating film 9, a silicon nitride film having a thickness of 200 nm to 300 nm is formed by plasma CVD. The protective insulating film 9 is provided to protect the channel region of the semiconductor layer 5, the source electrode 7, and the drain electrode 8 from external impurities and water. Therefore, in a case where the organic insulating film 10 as its upper layer has a sufficient protective function, the protective insulating film 9 may be omitted.

On the protective insulating film 9, an acrylic series photosensitive organic resin material is applied as the material of the organic insulating film 10 to be 2.0 μm to 3.0 μm in thickness by spin coating. Thus, an uneven upper surface of the transparent insulating substrate 1 formed through the above production process is covered so as to be planarized. As the material of the organic insulating film 10, in addition to the acrylic series organic resin material, an olefin series material, novolac series material, polyimide series material, or siloxane series material can be used. These coating-type organic insulating materials are low in permittivity, and wiring capacity can be kept low. Thus, when the above material is used, the TFT array substrate can be driven at low voltage, which contributes to low power consumption.

In addition, when the thick organic insulating film 10 is provided on the gate wiring 51 and the source wiring 52, liquid crystal molecules sandwiched between the TFT array substrate and the opposed substrate are not likely to be affected by an electric field generated by the gate wiring 51 and the source wiring 52. Therefore, the pixel electrode 16 formed on the organic insulating film 10 can be arranged so as to partially overlap with the source wiring 52, so that there is an advantage that a pixel area can be increased.

Then, the organic insulating film 10 is patterned by photoengraving and development to form the drain electrode contact hole 31, the common wiring contact hole 32, the gate terminal contact hole 33, and the source terminal contact hole 34. In FIG. 2, a side wall of each contact hole is vertically shown to simplify the drawing, but actually, the side wall of each contact hole forms an angle of 50° to 70° with the surface of the transparent insulating substrate 1, and each contact hole has a tapered shape.

Then, a baking process is performed at 200° C. to 230° C. for about 60 minutes under the atmosphere to bake the organic insulating film 10. A withstand voltage and hardness as the insulating film are increased through the baking. Thus, dry etching using the organic insulating film 10 as a mask can be performed in a following step.

Then, the protective insulating film 9 and the gate insulating film 4 are etched away by the dry etching using the planarizing organic insulating film 10 as the mask. Through this dry etching, the drain electrode contact hole 31 reaches the drain electrode 8, the common wiring contact hole 32 reaches the common wiring 3, the source terminal contact hole 34 reaches the source terminal electrode 19, and the gate terminal contact hole 33 reaches the gate terminal electrode 18.

Then, an ITO film serving as a transparent conductive film is formed to be 50 nm to 80 nm in thickness on the organic insulating film 10 by DC magnetron sputtering. As a sputtering gas, an Ar gas mixed with water vapor is used. This ITO film is patterned by photoengraving and wet etching with a photoresist to form the lead-out wiring 11 and the common electrode 12. As a wet etching solution for the ITO film, oxalic acid is used.

Then, an Al—Ni—Nd film is formed to be 100 nm in thickness, and patterned by photoengraving and wet etching with a photoresist to form the metal cap film 13 on the lead-out wiring 11 and the metal cap film 14 on the common electrode 12. An end of the metal cap film 13 may be provided inside an end of the lead-out wiring 11 as shown in FIG. 2, or may be provided outside the lead-out wiring 11 so that the end of the lead-out wiring 11 is covered with the metal cap film 13. In addition, the Al—Ni—Nd film (the metal cap film 13 and the metal cap film 14) is removed from a region through which light from a backlight passes (transmissive pixel part).

Then, the interlayer insulating film 15 is formed on the whole upper surface of the transparent insulating substrate 1. In this case, a silicon nitride film having relative permittivity of 6 to 7 and a thickness of 200 nm to 300 nm is formed by plasma CVD. Since heat resistance of the organic resin material of the organic insulating film 10 is as low as 220° C. to 250° C., a film forming temperature at this time is set at 220° C. When the permittivity of the interlayer insulating film 15 is high, a fringe electric field is enhanced in the FFS mode liquid crystal display device especially, so that the liquid crystal can be driven at low voltage.

After the interlayer insulating film 15 has been formed, the lead-out wiring contact hole 35 is formed in the interlayer insulating film 15 by photoengraving and dry etching with a photoresist. At this time, the interlayer insulating film 15 formed in the gate terminal contact hole 33 and the source terminal contact hole 34 is also removed, and the gate terminal electrode 18 and the source terminal electrode 19 are exposed in the gate terminal contact hole 33 and the source terminal contact hole 34, respectively.

Then, an ITO film serving as a transparent conductive film having a thickness of 50 nm to 80 nm is formed by a DC magnetron method. This ITO film is patterned by photoengraving and wet etching with a photoresist, whereby the pixel electrode 16, the gate terminal pad 20, and the source terminal pad 21 are formed. The pixel electrode 16 is connected to the metal cap film 13 on the lead-out wiring 11 through the lead-out wiring contact hole 35. The gate terminal pad 20 is connected to the gate terminal electrode 18 through the gate terminal contact hole 33. The source terminal pad 21 is connected to the source terminal electrode 19 through the source terminal contact hole 34.

Through the above steps, the TFT array substrate according to the first preferred embodiment shown in FIGS. 1 and 2 is completed.

After that, an oriented film is formed on the TFT array substrate, and bonded to a separately prepared opposed substrate having a color filter and an opposed electrode through a spacer, and the liquid crystal is injected into the gap between the substrates, whereby a liquid crystal panel is completed. The liquid crystal panel is housed in a case together with a backlight unit and a peripheral circuit, whereby a liquid crystal display device is produced.

Hereinafter, an effect provided by the TFT array substrate according to the first preferred embodiment will be described.

As for the TFT array substrate including the thick organic insulating film 10, since aspect ratios of the drain electrode contact hole 31 and the common wiring contact hole 32 are high, the interlayer insulating film 15 is not likely to be uniformly formed in each of them, so that pinholes are likely to be generated in partially thinned parts. As for the conventional TFT array substrate not having the metal cap film 13 and the metal cap film 14, when the pixel electrode 16 is patterned, an etching solution passes through the pinholes in the interlayer insulating film 15, reaches the lead-out wiring 11 in the drain electrode contact hole 31 and the common electrode 12 in the common wiring contact hole 32, and dissolves (erodes) them, which causes a connection defect and a resistance increase.

Meanwhile, according to this preferred embodiment, the lead-out wiring 11 in the drain electrode contact hole 31 is covered with the metal cap film 13, and the common electrode 12 in the common wiring contact hole 32 is covered with the metal cap film 14. Therefore, even when the pinholes are generated in the interlayer insulating film 15, an etching solution used for patterning the pixel electrode 16 is prevented from reaching the lead-out wiring 11 and the common electrode 12, so that the above problem is prevented from being generated. In addition, when this problem is solved, the interlayer insulating film 15 can be further thinned to enhance the fringe electric field, so that the liquid crystal can be driven at low voltage. Furthermore, even when the common electrode 12 is thinned in order to increase the transmittance, there is an advantage that mechanical strength can be ensured by the metal cap film 14, and the common electrode 12 can be prevented from being broken in the common wiring contact hole 32.

In addition, according to this preferred embodiment, the pixel electrode 16 is not connected to the lead-out wiring 11 but connected to the metal cap film 13 provided on the lead-out wiring 11 through the lead-out wiring contact hole 35.

Meanwhile, according to the conventional structure not having the metal cap film 13, the lead-out wiring 11 composed of the transparent conductive film (such as ITO) is exposed in a bottom part of the lead-out wiring contact hole 35. In this case, when the lead-out wiring contact hole 35 is formed by dry etching, an abnormal part called "notch" shown in FIG. 3 is formed in an edge of the bottom part of the lead-out wiring contact hole 35. FIG. 3 shows a schematic view of a notch shape. FIG. 3 shows the case where the interlayer insulating film 15 (SiN film) is directly formed on the lead-out wiring 11 (ITO film), and the notch is formed when the lead-out wiring contact hole 35 is formed in the interlayer insulating film 15.

In a normal case, the SiN film is formed by plasma CVD with component gas of $SiH_4$ (silane), $NH_3$ (ammonia), and $N_2$ (nitrogen). At this time, ITO of the transparent oxide conductive film is reduced by a hydrogen radical generated due to decomposition of $SiH_4$ and $NH_3$, so that O (oxygen) from ITO is supplied to plasma. As a result, a part of the SiN film (a part being in contact with ITO) formed in an early stage of the film formation contains oxygen, so that dry etching rate in this part is higher than in other part.

Therefore, when the interlayer insulating film 15 (SiN) in which the lead-out wiring contact hole 35 is to be formed is formed directly on the lead-out wiring 11 (ITO), the notch is formed in the edge of the bottom part of the lead-out wiring contact hole 35 due to over-etching that occurs when the lead-out wiring contact hole 35 is formed. According to this preferred embodiment, since the metal cap film 13 (Al alloy) is exposed in the bottom part of the lead-out wiring contact hole 35, such problem is not generated, so that a preferable contact hole shape can be provided, and the pixel electrode 16 can be prevented from being broken in the lead-out wiring contact hole 35.

According to this preferred embodiment, the pixel electrode 16 (ITO) is connected to the metal cap film 13 (Al alloy) through the lead-out wiring contact hole 35, but as another configuration as shown in FIG. 4, the metal cap film 13 may be partially removed in the lead-out wiring contact hole 35, and the lead-out wiring 11 (ITO) may be exposed. Interface resistance between ITO and ITO is lower than interface resistance between ITO and metal, so that interconnection resistance between the pixel electrode 16 and the lead-out wiring 11 can be small.

In this case, for example, in patterning the metal cap film 13, an opening having a diameter smaller than an inner diameter of the bottom part of the lead-out wiring contact hole 35 is to be previously formed in the metal cap film 13 in the position where the lead-out wiring contact hole 35 is formed. When the diameter of the opening provided in the metal cap film 13 is smaller than the inner diameter of the bottom part of the lead-out wiring contact hole 35, the notch can be prevented from being generated in the lead-out wiring contact hole 35.

According to this preferred embodiment, by forming the lead-out wiring 11, it is possible to prevent a failure in superposition of the drain electrode contact hole 31 and the lead-out wiring contact hole 35. In addition, this effect also contributes to prevent the drain electrode contact hole 31 from becoming enormous. For example, in a case where the pixel electrode 16 is directly connected to the drain electrode 8 of the TFT element 50 without the lead-out wiring 11, the lead-out wiring contact hole 35 and the drain electrode contact hole 31 need to be formed in the same position. In this case, the drain electrode contact hole 31 needs to be larger beyond necessity in view of misalignment between the drain electrode contact hole 31 and the lead-out wiring contact hole 35, but there is no need for that in this preferred embodiment.

According to this preferred embodiment, the lead-out wiring 11 and the common electrode 12, and the metal cap film 13 and the metal cap film 14 are separately patterned through the respective photoengraving steps, but they may be sequentially formed and completed by a halftone method (including a gray-tone method) through one photoengraving step. In this case, the TFT array substrate according to the first preferred embodiment can be produced with the same number of masks as that in the method for forming the conventional structure which does not have the metal cap film 13 and the metal cap film 14.

Figure 5:
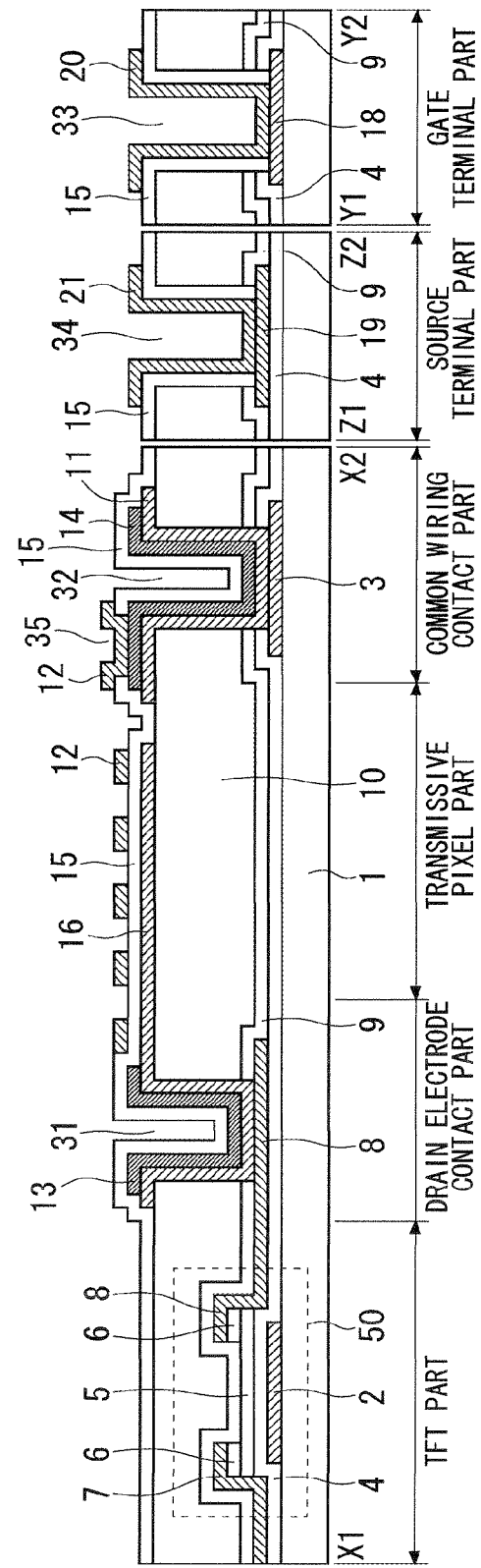

In addition, FIGS. 1 and 2 show the case where the pixel electrode 16 having the slits is arranged above the flat-plate common electrode 12, but contrary to this, the common electrode 12 having the slits may be formed above the flat-plate pixel electrode 16. In this case, as shown in FIG. 5, the pixel electrode 16 is formed on the organic insulating film 10 (under the interlayer insulating film 15), and connected to the drain electrode 8 of the TFT element 50 through the drain electrode contact hole 31. The metal cap film 13 is formed on the pixel electrode 16 in the drain electrode contact hole 31. In addition, the lead-out wiring 11 is formed so as to be connected to the common wiring 3 through the common wiring contact hole 32, and the metal cap film 14 is formed thereon. The common electrode 12 is formed on the interlayer insulating film 15, and connected to the metal cap film 14 on the lead-out wiring 11 through the lead-out wiring contact hole 35.

Second Preferred Embodiment

A large number of photoengraving steps (that is, the number of masks) is needed to form the FFS mode TFT array substrate including the organic insulating film serving as the planarizing insulating film, so that a producing time is long and production cost is high. Thus, this second preferred embodiment proposes a production method in which the required number of masks is reduced, and production process can be simplified.

A TFT array substrate in the second preferred embodiment includes a staggered type TFT element having a top gate structure. In this case, an amorphous silicon is used for a semiconductor layer, but polysilicon or microcrystalline silicon may be used therefor.

Figure 6:
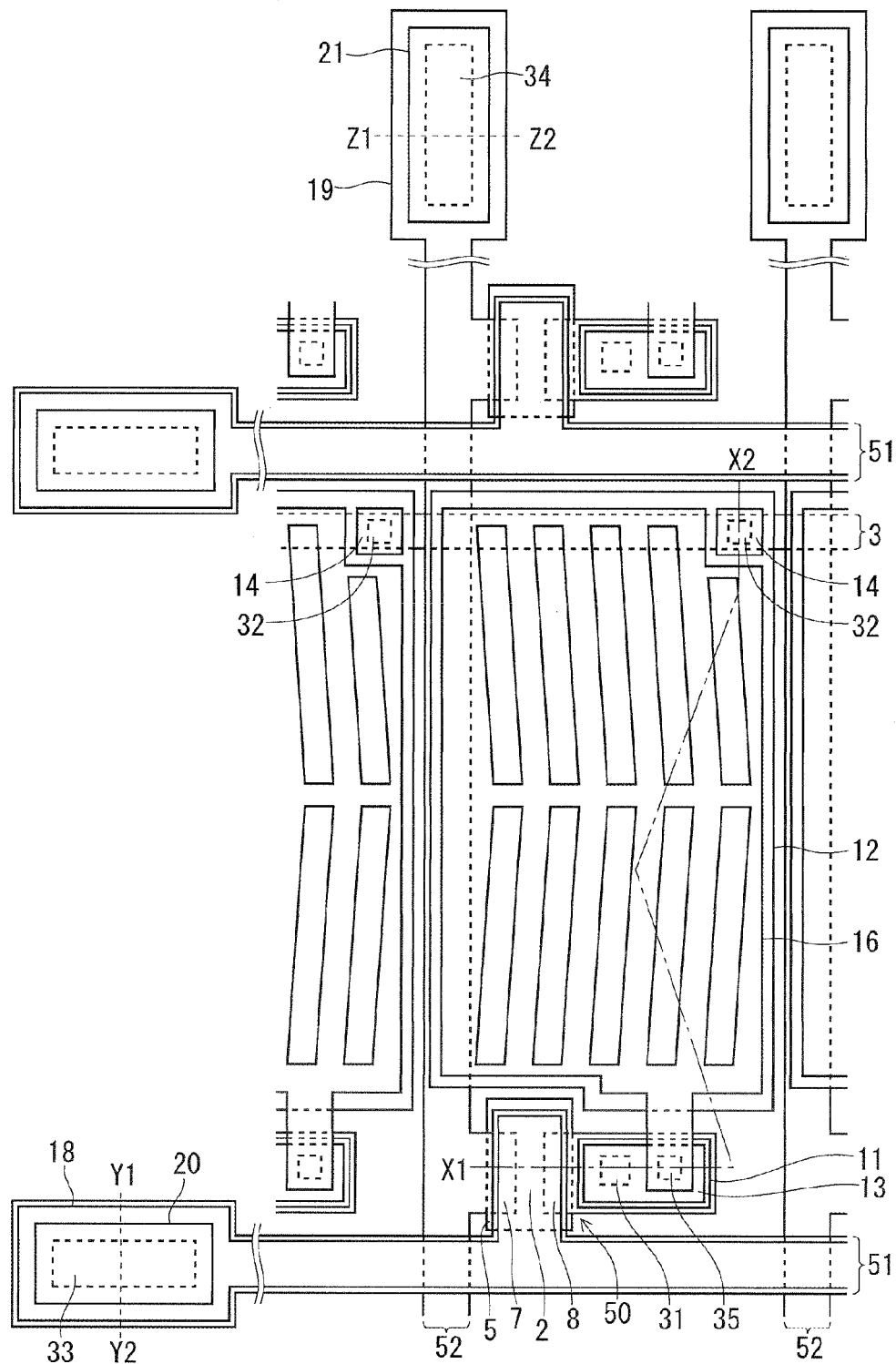
FIG. 6 is a plan view showing a configuration of a TFT array substrate according to a second preferred embodiment.
Figure 7:
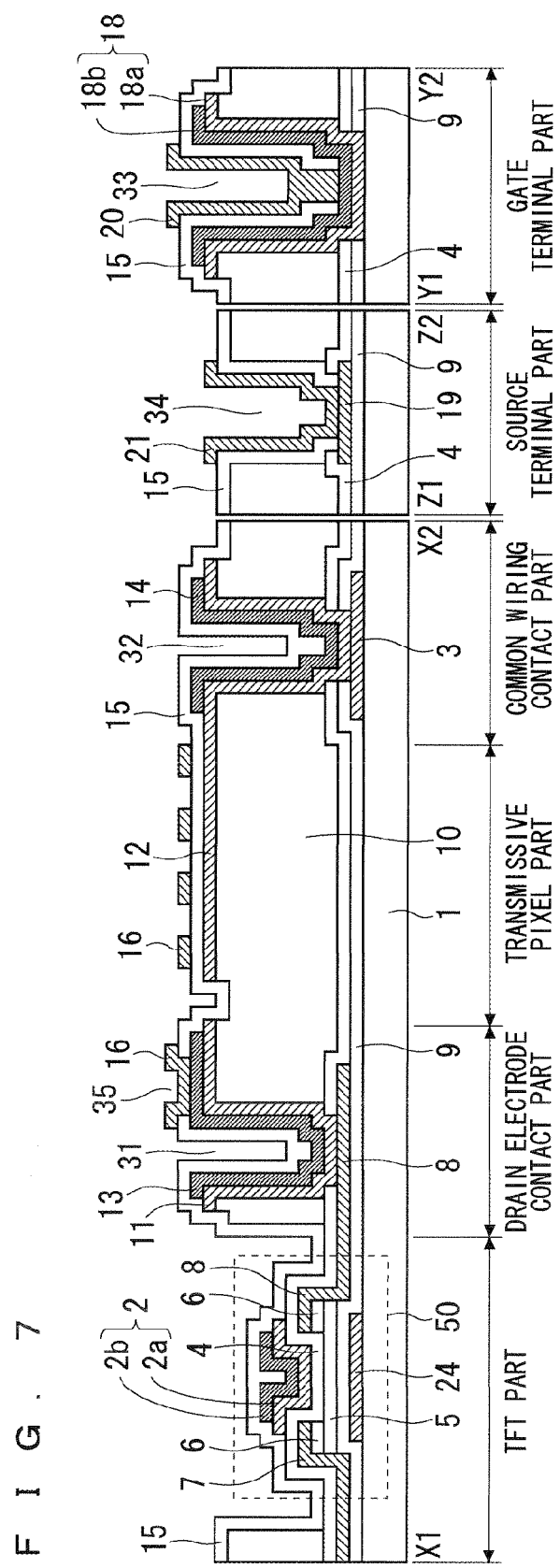
FIG. 7 is a cross-sectional view showing the configuration of the TFT array substrate according to the second preferred embodiment.

FIG. 6 is a plan view showing a configuration of the TFT array substrate according to the second preferred embodiment. In addition, FIG. 7 shows cross-sectional views of the TFT array substrate corresponding to cross-sectional surfaces taken along lines X1-X2, Y1-Y2, and Z1-Z2 in FIG. 6.

In the drawings, the same reference is given to a component having the same function as that in FIGS. 1 and 2.

Since the TFT element 50 has the top gate structure, the gate wiring 51 and the gate electrode 2 are formed above the source wiring 52, the source electrode 7, and the drain electrode 8. In addition, the staggered type TFT element includes a light blocking film 24 below the semiconductor layer 5 (channel layer) in order to prevent a light current from being generated.

In addition, the gate electrode 2 has a two-layer structure including a lower layer 2a formed of the same layer as that of the lead-out wiring 11 and the common electrode 12, and an upper layer 2b formed of the same layer as that of the metal cap film 13 and the metal cap film 14. Similarly, the gate terminal electrode 18 also has a two-layer structure including a lower layer 18a formed of the same layer as that of the lead-out wiring 11 and the common electrode 12, and an upper layer 18b formed of the same layer as that of the metal cap film 13 and the metal cap film 14.

Hereinafter, a method for producing the TFT array substrate according to the second preferred embodiment will be described.

First, an Al alloy (such as Al—Ni—Nd) film having a thickness of 200 nm is formed on the transparent insulating substrate 1 made of glass by DC magnetron sputtering. Then, the Al alloy film is patterned by photoengraving and wet etching with a photoresist to form the light blocking film 24 and the common wiring 3. The Al—Ni—Nd film having the thickness of 200 nm sufficiently blocks the light, and has sufficient conductivity as the wiring.

Then, a silicon nitride film serving as the protective insulating film 9 is formed so as to cover the whole upper surface of the transparent insulating substrate 1 by plasma CVD.

Then, an intrinsic amorphous silicon film as the material of the semiconductor layer 5 of the TFT element 50, and a phosphor-doped n-type amorphous silicon film as the material of the ohmic contact layer 6 are sequentially formed by plasma CVD. Then, they are patterned by photoengraving and dry etching with a photoresist, whereby island patterns of the semiconductor layer 5 and the ohmic contact layer 6 are formed in the region where the TFT element 50 is formed.

Then, a metal film composed of a Mo alloy, chrome, Al alloy (such as Al—Ni—Nd), or the like serving as the material of the source wiring 52, the source electrode 7, the drain electrode 8, the source terminal electrode 19, and the like is formed by DC magnetron sputtering. In this case, a laminated structure is formed in such a manner that a MoNb alloy and an Al—Ni—Nd alloy each having a thickness of 100 nm are laminated. Then, the metal film is patterned by photoengraving and wet etching with a photoresist, whereby the source wiring 52, the source electrode 7, the drain electrode 8, and the source terminal electrode 19 are formed.

At this time, the n-type amorphous silicon film (ohmic contact layer 6) provided between the source electrode 7 and the drain electrode 8 is removed by dry etching using the same photoresist pattern as in the wet etching, and the surface of the semiconductor layer 5 (channel region) is exposed. Then, a silicon nitride film as the gate insulating film 4 is formed by plasma CVD so as to cover the whole upper surface of the transparent insulating substrate 1.

Figure 8:
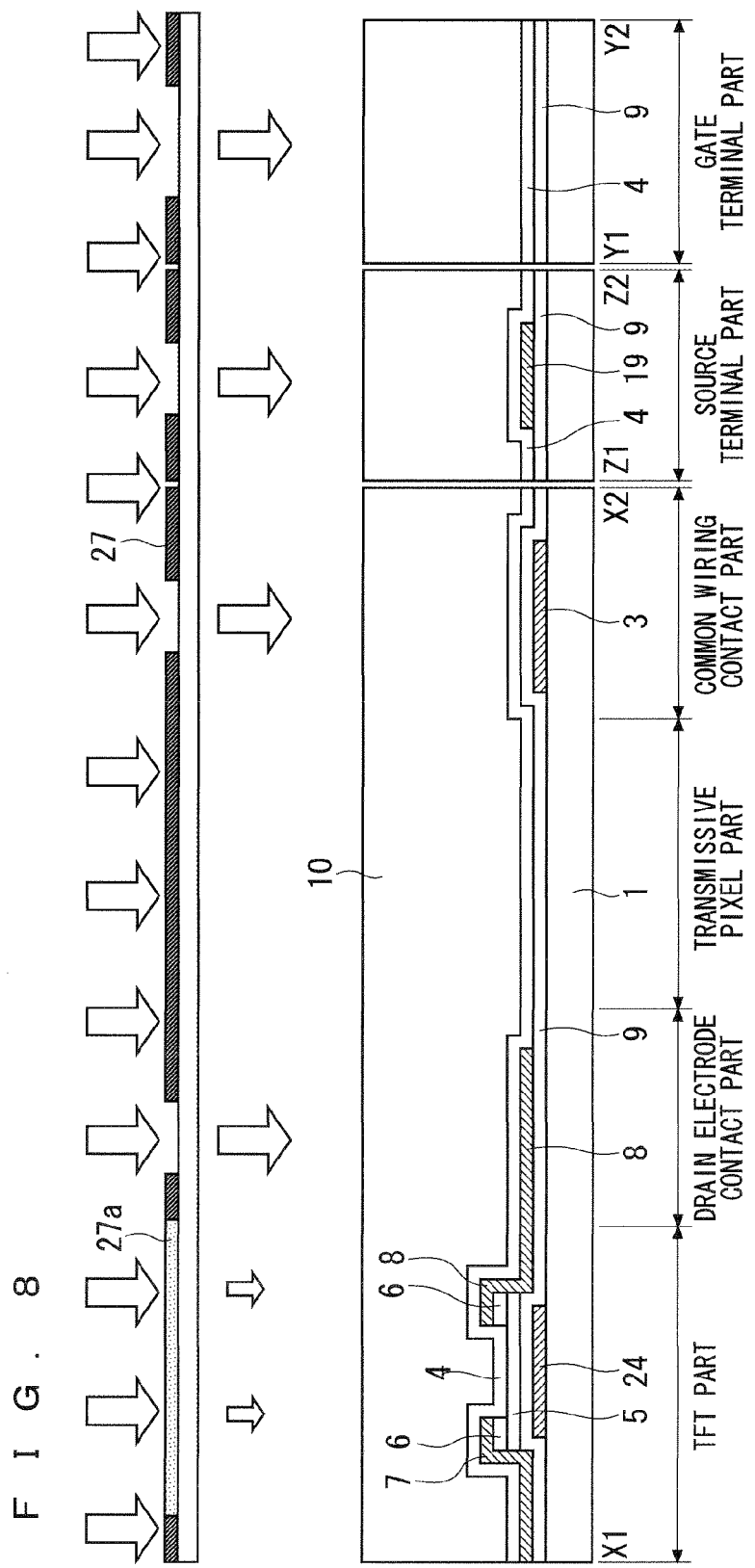
FIGS. 8 to 15 are views each showing a production step of the TFT array substrate according to the second preferred embodiment.

Then, a planarizing material composed of an acrylic series positive type photosensitive resin is applied so as to cover the whole upper surface of the transparent insulating substrate 1, whereby the organic insulating film 10 having a thickness of about 2.5 μm is formed. Then, the organic insulating film 10 is exposed through a previously prepared photomask 27. The photomask 27 has openings for forming the drain electrode contact hole 31, the common wiring contact hole 32, the gate terminal contact hole 33, and the source terminal contact hole 34. A light blocking film pattern is formed in a part other than the openings, and a region of the light blocking film pattern for blocking the exposure light corresponds to a region where the organic insulating film 10 is left. In addition, the photomask 27 has a semipermeable pattern (halftone mask 27a) to reduce light intensity of the exposure light, in a part corresponding to the region where the TFT element 50 is formed, and the organic insulating film 10 in this region is exposed to the light attenuated through the halftone mask 27a (FIG. 8).

Figure 9:
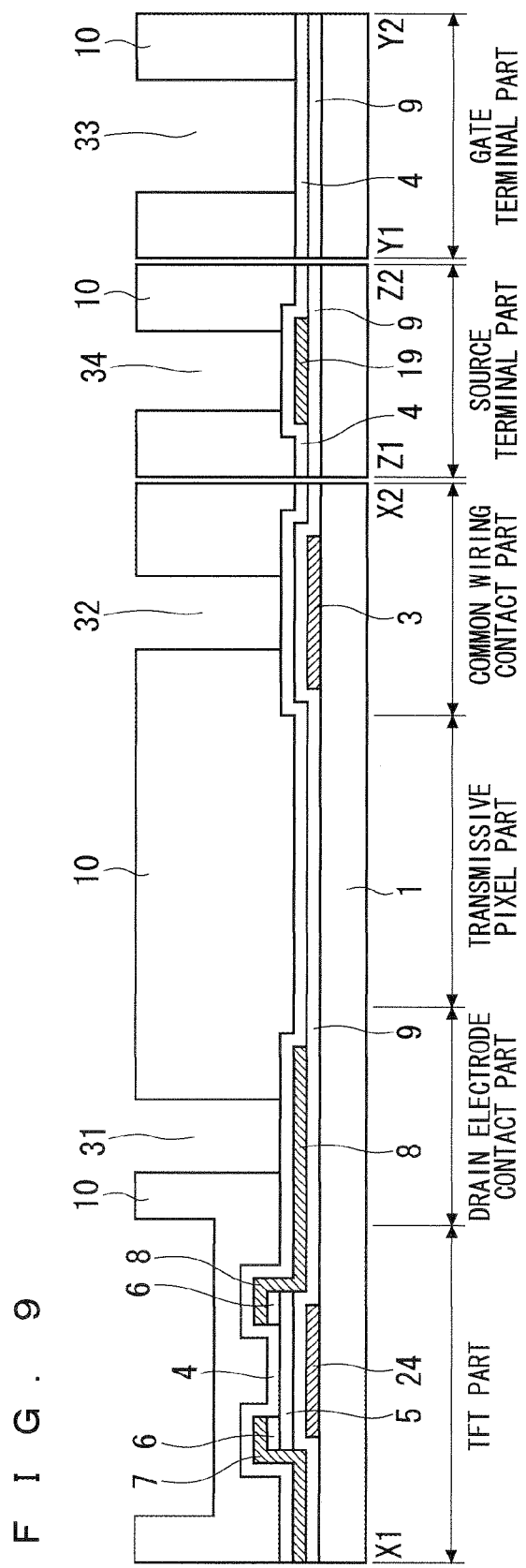

After the organic insulating film 10 has been exposed through the photomask 27, it is developed with an organic alkali series developing solution diluted with water so that 0.4 wt. % of tetramethylammonium hydroxide (TMAH) is provided. Thus, as shown in FIG. 9, the drain electrode contact hole 31, the common wiring contact hole 32, the gate terminal contact hole 33, and the source terminal contact hole 34 are formed. At this time, the organic insulating film 10 is thinly left in the region where the TFT element 50 is formed after exposed through the halftone mask 27a, compared with an unexposed region. According to this preferred embodiment, the thin organic insulating film 10 having a film thickness of about 0.5 µm is left in the region where the TFT element 50 is formed.

Figure 10:
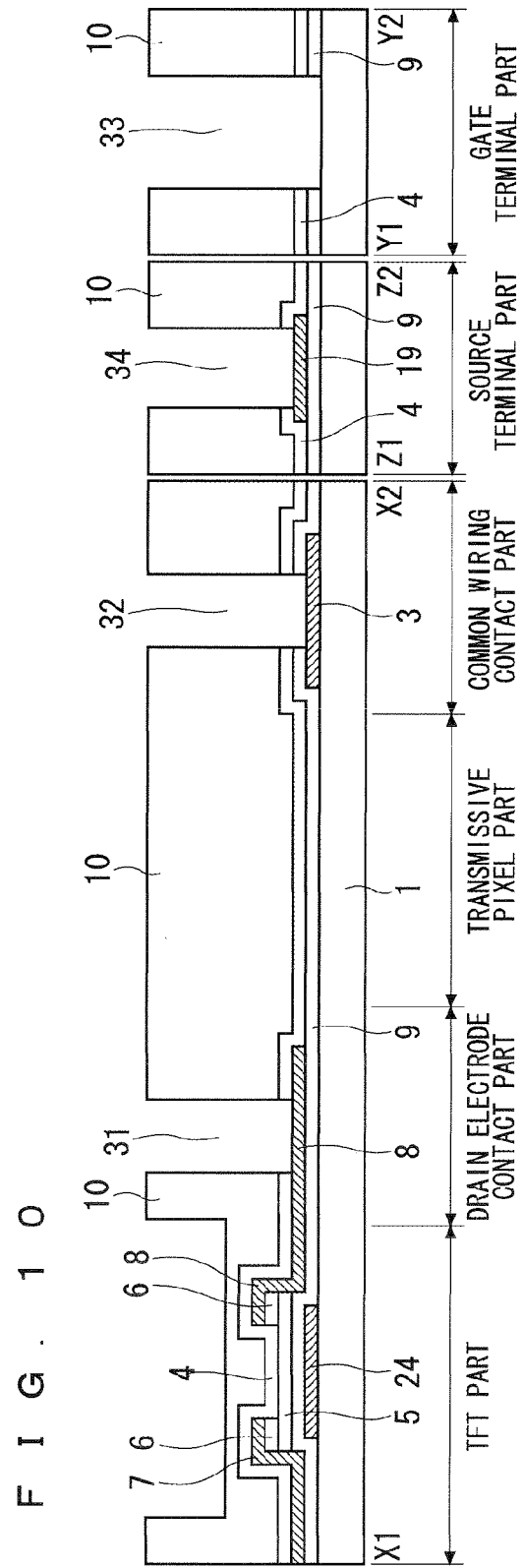

Then, as shown in FIG. 10, the protective insulating film 9 and the gate insulating film 4 in the bottoms of the drain electrode contact hole 31, the common wiring contact hole 32, the gate terminal contact hole 33, and the source terminal contact hole 34 are removed by etching with the organic insulating film 10 used as a mask. Thus, the drain electrode 8 is exposed in the drain electrode contact hole 31, the common wiring 3 is exposed in the common wiring contact hole 32, the transparent insulating substrate 1 is exposed in the gate terminal contact hole 33, and the source terminal electrode 19 is exposed in the source terminal contact hole 34. In this etching step, dry etching using fluorine series gas is used. The dry etching condition is adjusted so that the thin part in the region where the TFT element 50 is formed is not completely removed because the thickness of the organic insulating film 10 is reduced by this dry etching. In a case where the organic insulating film 10 in the region where the TFT element 50 is formed is eliminated in the course of this dry etching, the thickness of the gate insulating film 4 is reduced, and characteristics of the TFT element 50 are deteriorated.

Figure 11:
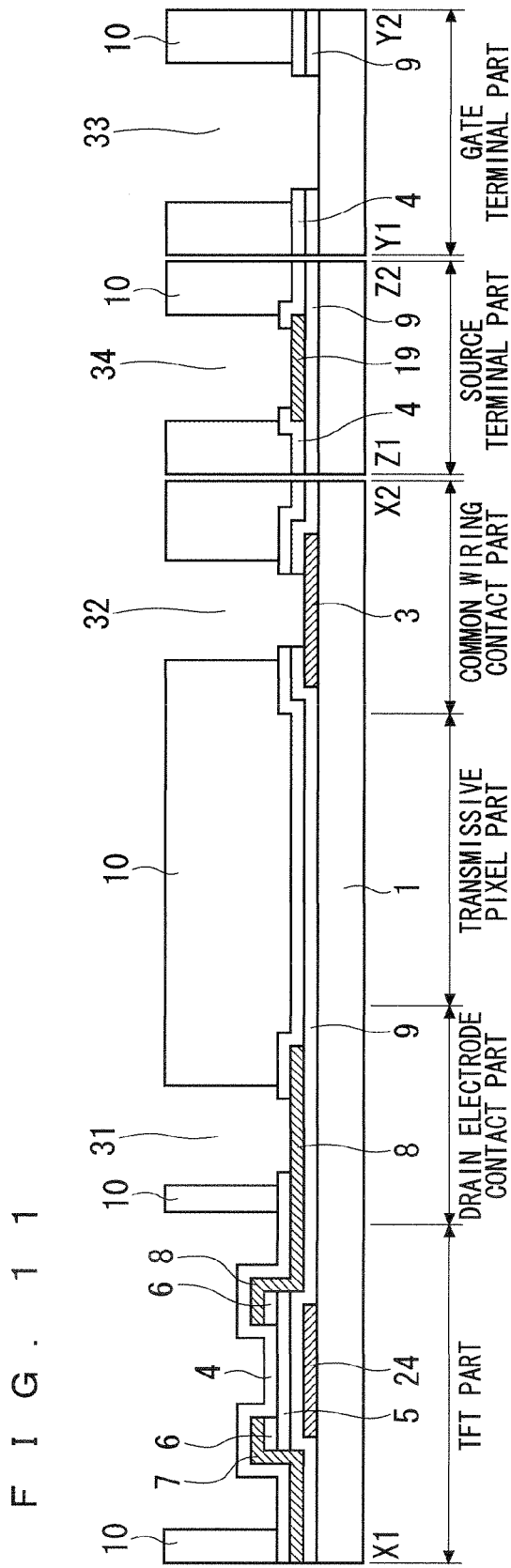

Then, the thickness of the organic insulating film 10 is wholly reduced by $O_2$ ashing to remove the thin organic insulating film 10 on the region where the TFT element 50 is formed (FIG. 11). Unless the organic insulating film 10 on the region where the TFT element 50 is formed is removed, the organic insulating film 10 having the low permittivity is left on the gate insulating film 4, so that gate capacity is decreased, and an on current of the TFT element 50 is decreased. Therefore, it is preferable that the organic insulating film 10 in the region where the TFT element 50 is formed is completely removed by ashing.

Figure 12:
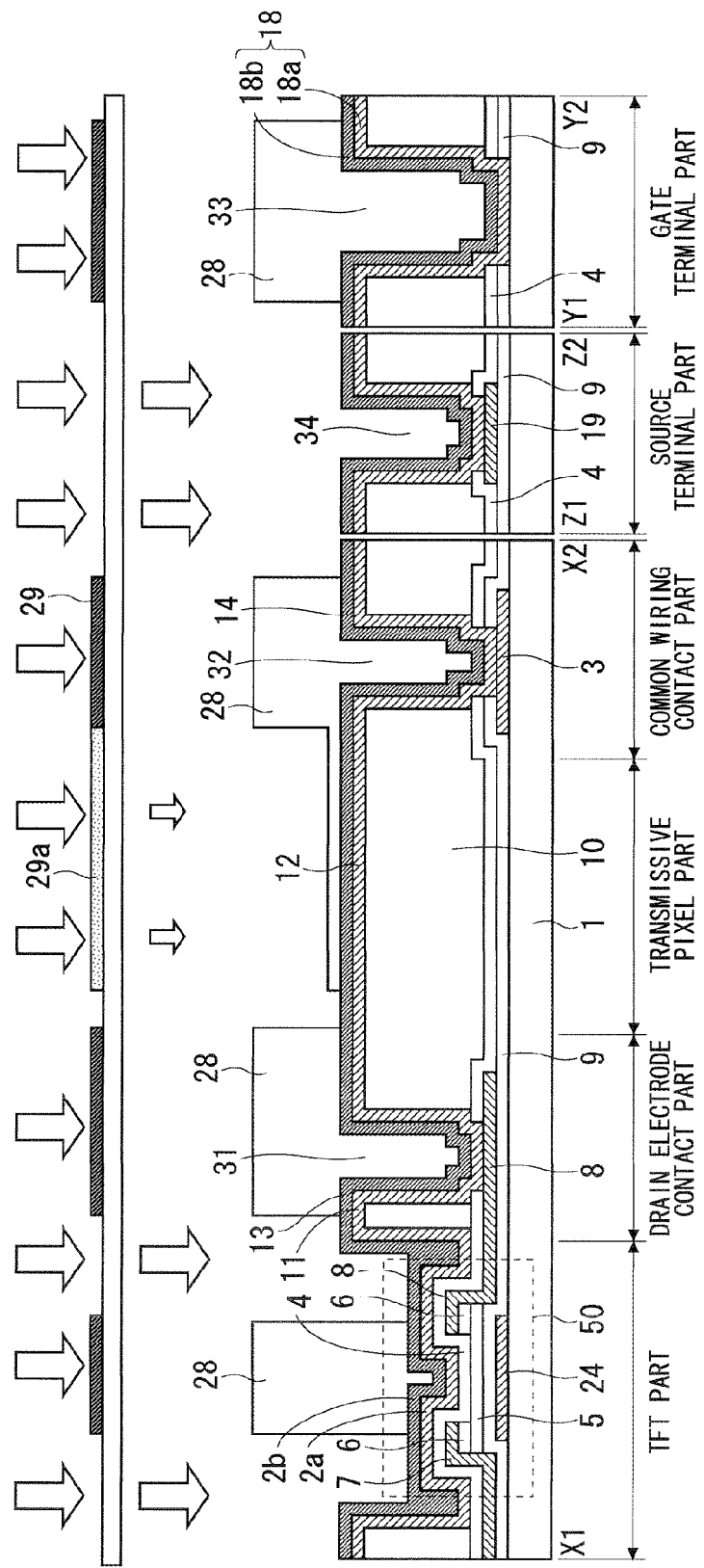

Then, a transparent conductive film of ITO and a metal film of Al alloy are sequentially formed. Then, a photoresist composed of a novolac series positive type photoresist resin is applied to form a photoresist 28 having a thickness of about 1.5 µm. Then, the photoresist 28 is exposed with a previously prepared photomask 29. The photomask 29 has a light blocking mask pattern to form the patterns of the gate electrode 2, the lead-out wiring 11, the common electrode 12, and the gate terminal electrode 18. In addition, the photomask 29 has a semipermeable pattern (halftone mask 29a) in a part corresponding the region where the common electrode 12 is formed, and this region is exposed to light attenuated through the halftone mask 29a (FIG. 12).

After the photoresist 28 has been exposed through the photomask 29, it is developed with an organic alkali series developing solution containing tetramethylammonium hydroxide (TMAH). Thus, as shown in FIG. 12, the photoresist 28 is removed except for the parts corresponding to the gate electrode 2, the lead-out wiring 11, the common electrode 12, and the gate terminal electrode 18. At this time, the photoresist 28 is thinly left in the region where the common electrode 12 is formed after exposed through the halftone mask 29a, compared with an unexposed region. According to this preferred embodiment, the thin photoresist 28 having a film thickness of about 0.2 µm is left in the region where the common electrode 12 is formed.

Figure 13:
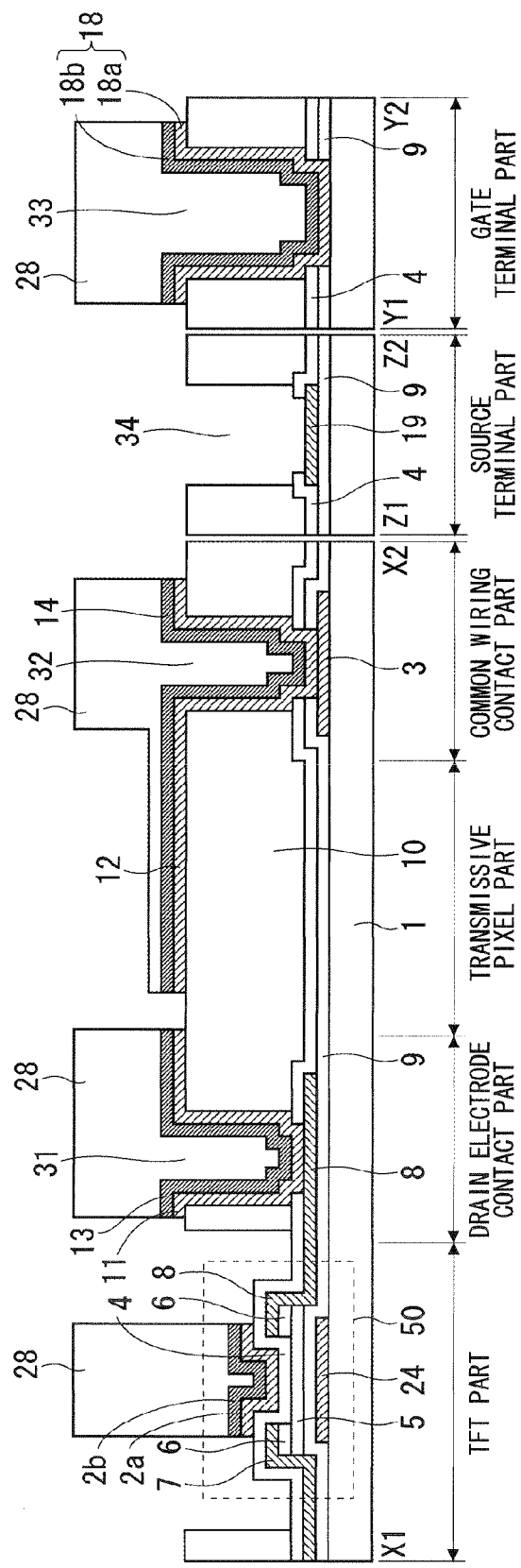

Then, as shown in FIG. 13, the ITO film and the Al alloy film are etched by wet etching with the photoresist 28 used as a mask. The Al alloy film is etched with a mixed solution of phosphoric acid, nitric acid, and acetic acid, and then the ITO film is etched with oxalic acid, whereby they are patterned into desired shapes. Thus, the gate electrode 2, the lead-out wiring 11, the common electrode 12, and the gate terminal electrode 18 are formed. Here, it is to be noted that the Al alloy is wholly left on the common electrode 12.

Figure 14:
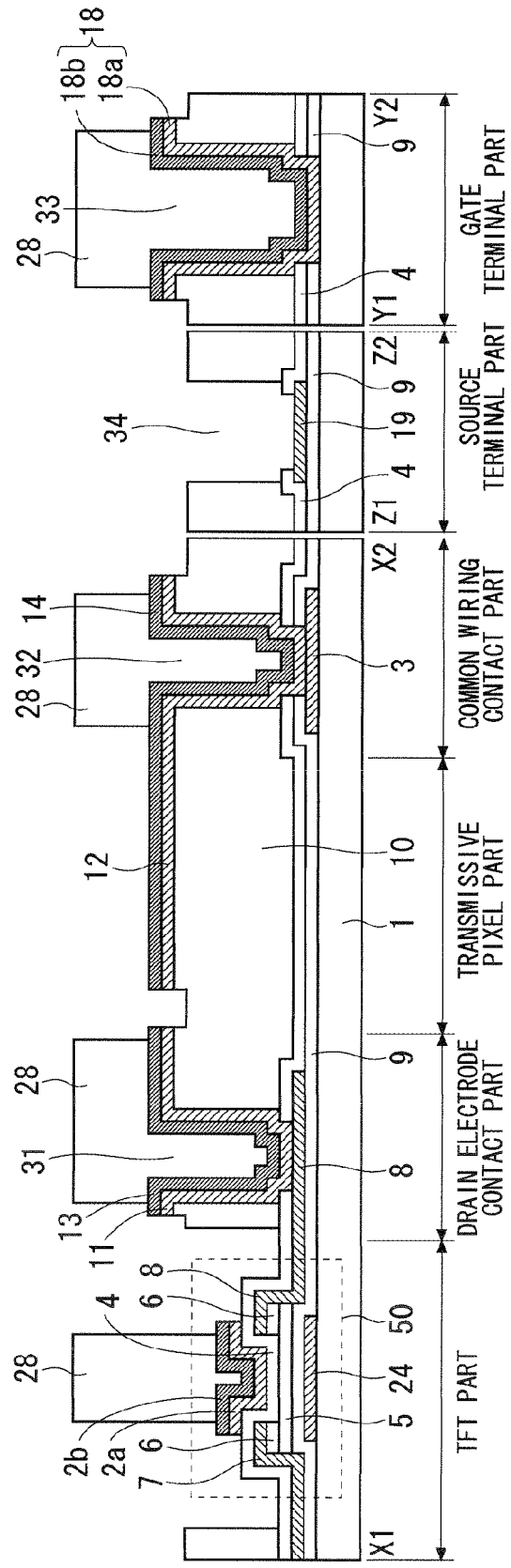
Figure 15:
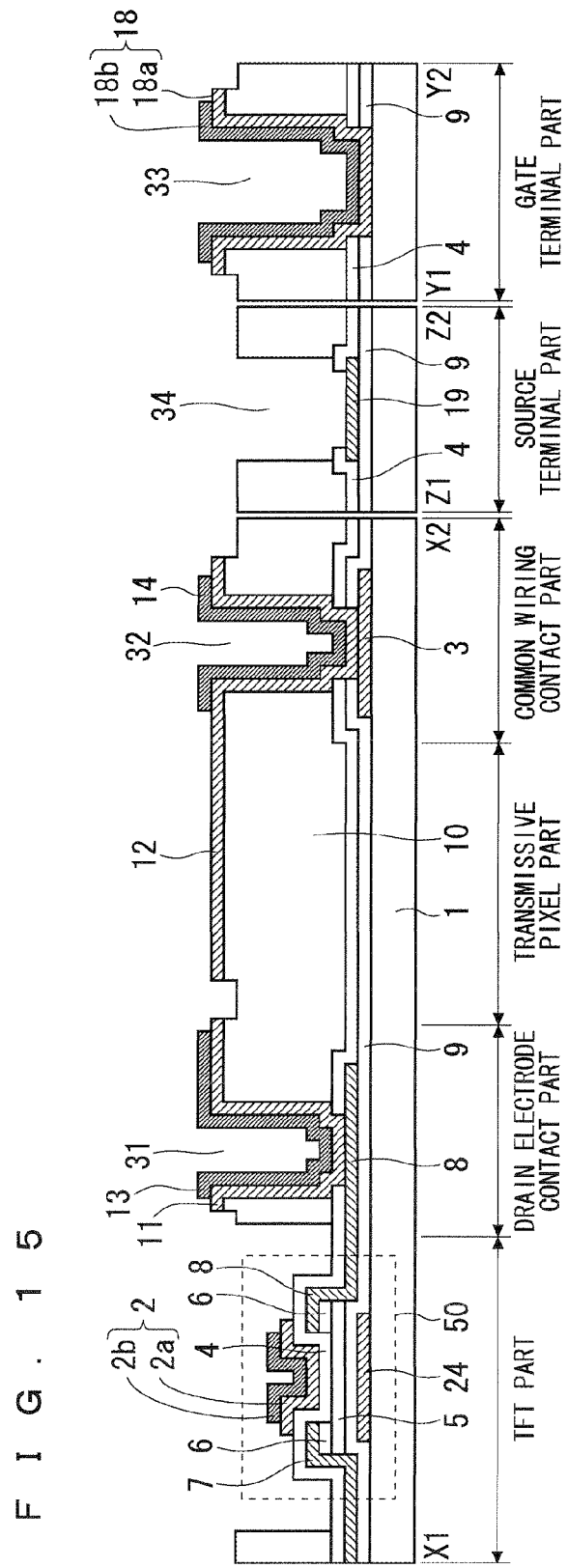

Then, a film thickness of the photoresist 28 is reduced as a whole by $O_2$ ashing, so that the thin photoresist 28 on the region where the common electrode 12 is formed is removed (FIG. 14). At this time, the organic insulating film 10 of the lower layer is slightly reduced. Then, the Al alloy film on the common electrode 12 is etched away again with the mixed solution of phosphoric acid, nitric acid, and acetic acid. At this time, the Al alloy exposed when the photoresist 28 is retreated by ashing is also etched away. After that, the photoresist 28 is removed (FIG. 15).

As a result, the gate electrode 2, the lead-out wiring 11, the common electrode 12, and the gate terminal electrode 18 are collectively formed. The Al alloy on the lead-out wiring 11 serves as the metal cap film 13 and covers the lead-out wiring 11 in the drain electrode contact hole 31. In addition, the Al alloy left on the common electrode 12 serves as the metal cap film 14 and covers the common electrode 12 in the common wiring contact hole 32. The metal cap film 13 and the metal cap film 14 can prevent the lead-out wiring 11 and the common electrode 12 from being eroded, respectively by an etching solution at the time of patterning the pixel electrode 16, similarly to the first preferred embodiment.

Then, a SiN film is formed by plasma CVD to form the interlayer insulating film 15, and the lead-out wiring contact hole 35 is formed in the interlayer insulating film 15. Then, an ITO film serving as a transparent conductive film is formed to be 50 nm to 80 nm in thickness by DC magnetron method, and patterned, whereby the pixel electrode 16, the gate terminal pad 20, and the source terminal pad 21 are formed. The pixel electrode 16 is electrically connected to the Al alloy of the lead-out wiring 11 through the lead-out wiring contact hole 35.

As descried above, according to this preferred embodiment, the TFT array substrate including the staggered type TFT element which is generally produced through the nine photoengraving steps can be produced through the seven photoengraving steps.

Third Preferred Embodiment

A third preferred embodiment proposes a method for producing FFS mode TFT array substrate in which the number of masks is further reduced.

Like in the second preferred embodiment, in the case where the semiconductor layer 5 is formed of low-temperature polysilicon, amorphous silicon, microcrystalline silicon, or the like, a carrier is photoexcited by backlight because a bandgap of each material is small. As a result, an off leakage current is generated, and the problems such as crosstalk and display unevenness are generated when an image is displayed. According to the second preferred embodiment, in order to solve this problem, the light blocking film 24 is provided under the semiconductor layer 5.

However, in a case where an oxide semiconductor having a large bandgap is used for the semiconductor layer 5, such a problem is not generated, so that the light blocking film 24 is not needed, and the number of masks required in the production process can be reduced. Furthermore, the oxide semiconductor has high mobility, so that a low-power consumption and high-performance TFT array substrate can be provided.

Figure 16:
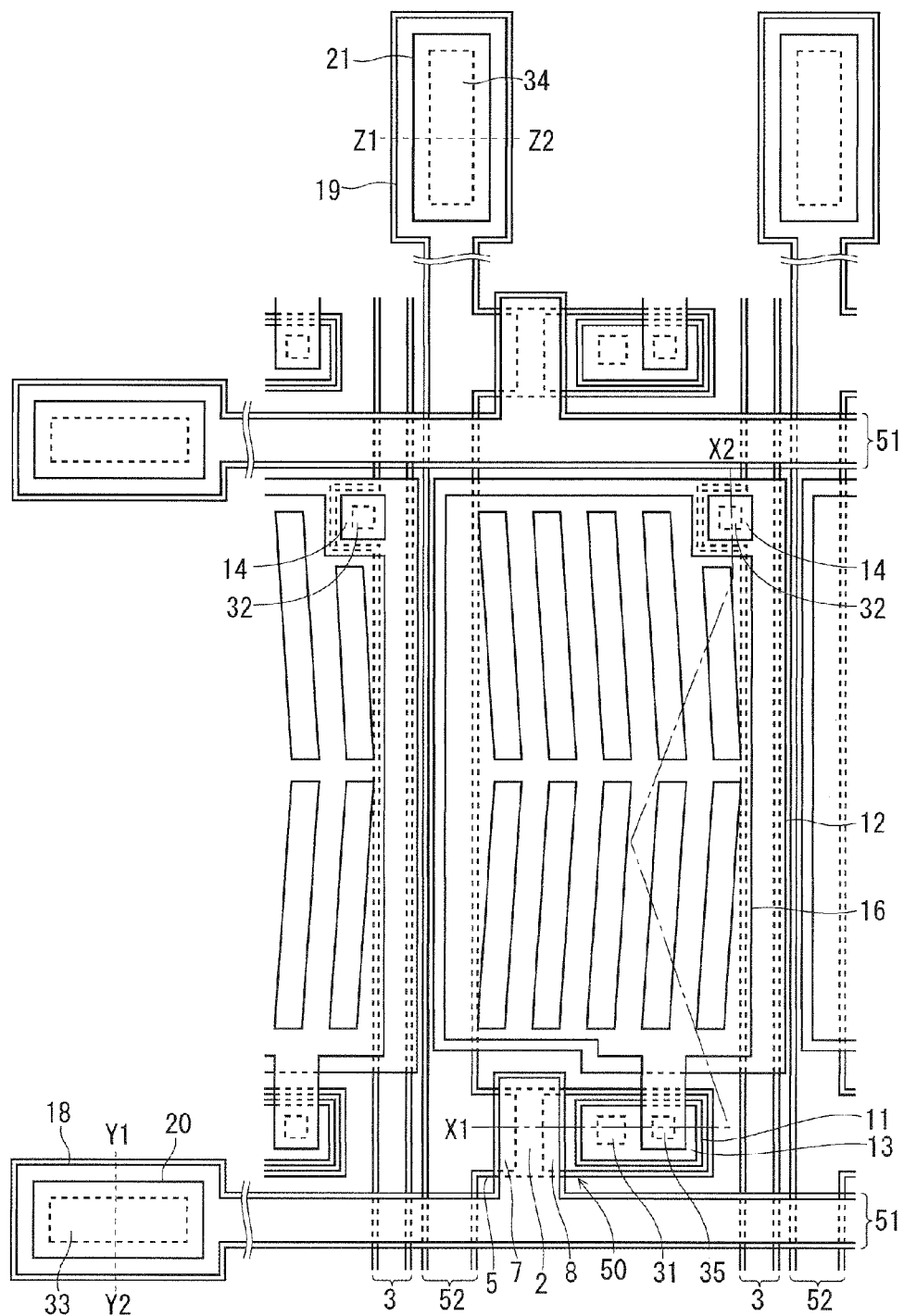
FIG. 16 is a plan view showing a configuration of a TFT array substrate according to a third preferred embodiment.
Figure 17:
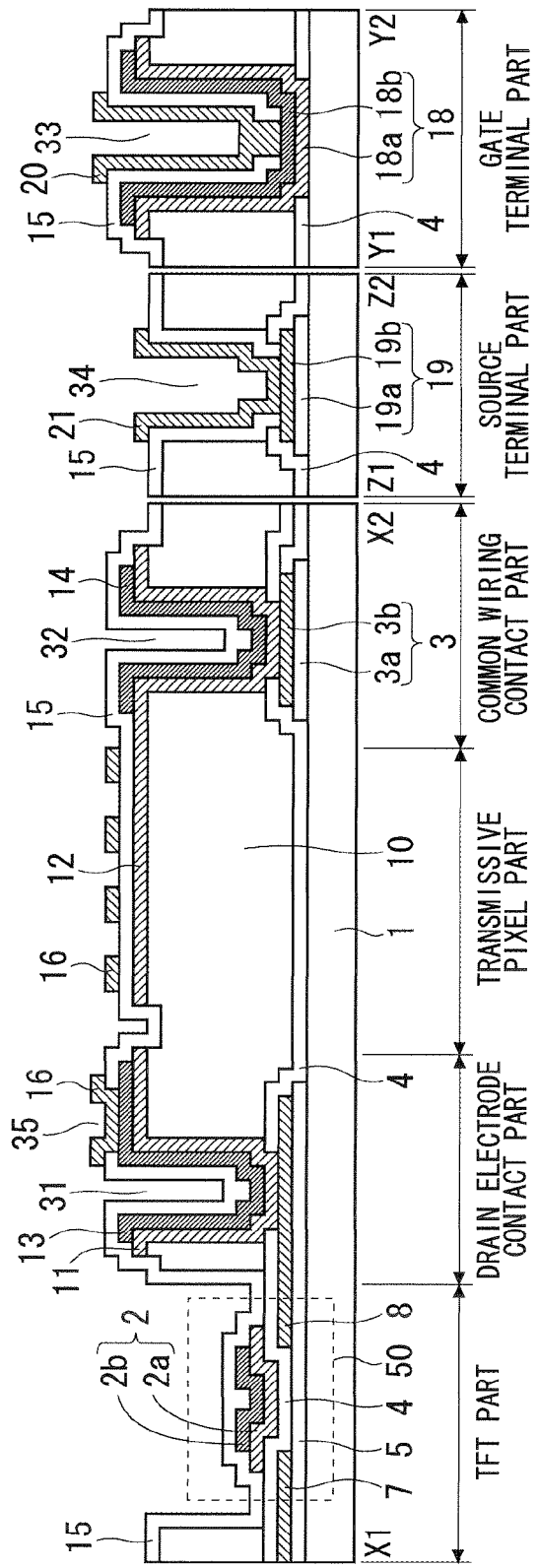
FIG. 17 is a cross-sectional view showing the configuration of the TFT array substrate according to the third preferred embodiment.

FIG. 16 is a plan view showing a configuration of the TFT array substrate according to the third preferred embodiment. In addition, FIG. 17 shows cross-sectional views of the TFT array substrate, corresponding to cross-sectional surfaces taken along lines X1-X2, Y1-Y2, and Z1-Z2 in FIG. 16. In the drawings, the same reference is given to a component having the same function as that in FIGS. 1 and 2.

Since the TFT element 50 in the third preferred embodiment also has the top gate structure, the gate wiring 51 and the gate electrode 2 are formed above the source wiring 52, the source electrode 7, and the drain electrode 8. According to this preferred embodiment, an oxide semiconductor is used for the semiconductor layer 5 of the TFT element 50, and a light blocking film is not provided under the semiconductor layer 5. The common wiring 3 is formed of the same layer as that of the source wiring 52, and extends in parallel to the source wiring 52.

The gate electrode 2 has the two-layer structure composed of the lower layer 2a formed of the same layer as that of the lead-out wiring 11 and the common electrode 12, and the upper layer 2b formed of the same layer as that of the metal cap film 13 and the metal cap film 14. Similarly, the gate terminal electrode 18 has the two-layer structure composed of the lower layer 18a formed of the same layer as that of the lead-out wiring 11 and the common electrode 12, and the upper layer 18b formed of the same layer as that of the metal cap film 13 and the metal cap film 14. The common wiring 3 has a two-layer structure composed of a lower layer 3a formed of the same layer as that of the semiconductor layer 5, and an upper layer 3b formed of the same layer as that of the source electrode 7 and the drain electrode 8. Similarly, the source terminal electrode 19 has a two-layer structure composed of a lower layer 19a formed of the same layer as that of the semiconductor layer 5, and an upper layer 19a formed of the same layer as that of the source electrode 7 and the drain electrode 8.

Hereinafter, a method for producing the TFT array substrate according to the third preferred embodiment will be described.

First, an oxide semiconductor film 41 serving as the semiconductor layer 5 is formed on the transparent insulating substrate 1 made of glass. According to this preferred embodiment, an In—Zn—Sn—O film having a thickness of 50 nm is formed by DC magnetron sputtering with an In—Zn—Sn—O target [$IN_2O_3.(ZnO)_6.(SnO_2)_2$] in which an atomic composition ratio of In:Zn:Sn:O is 2:6:2:13. At this time, when the sputtering is performed with Ar gas, a formed oxide film is in an oxygen deficient state (composition ratio of O is less than 13 in the above example) because an atomic composition ratio of oxygen is less than the stoichiometric composition in general. Therefore, it is desirable that the sputtering is performed with mixed gas of Ar gas and oxygen gas. According to this preferred embodiment, the sputtering is performed with mixed gas in which $O_2$ gas is added to Ar gas at a division ratio of 5%. The In—Zn—Sn—O film just after it has been formed has an amorphous structure, and it is soluble in a chemical solution containing an oxalic acid. On the other hand, its film thickness is hardly reduced in a PAN series chemical solution even after it has been soaked for 5 minutes at solution temperatures from 20° C. to 40° C., so that etching cannot be performed with it.

A metal film 42 serving as the materials of the source wiring 52, the source electrode 7, and the drain electrode 8 is formed on the oxide semiconductor film 41. According to this preferred embodiment, a laminated structure is formed by DC magnetron sputtering in such a manner that a MoNb alloy and an Al—Ni—Nd alloy each having a thickness of 100 nm are laminated.

Figure 18:
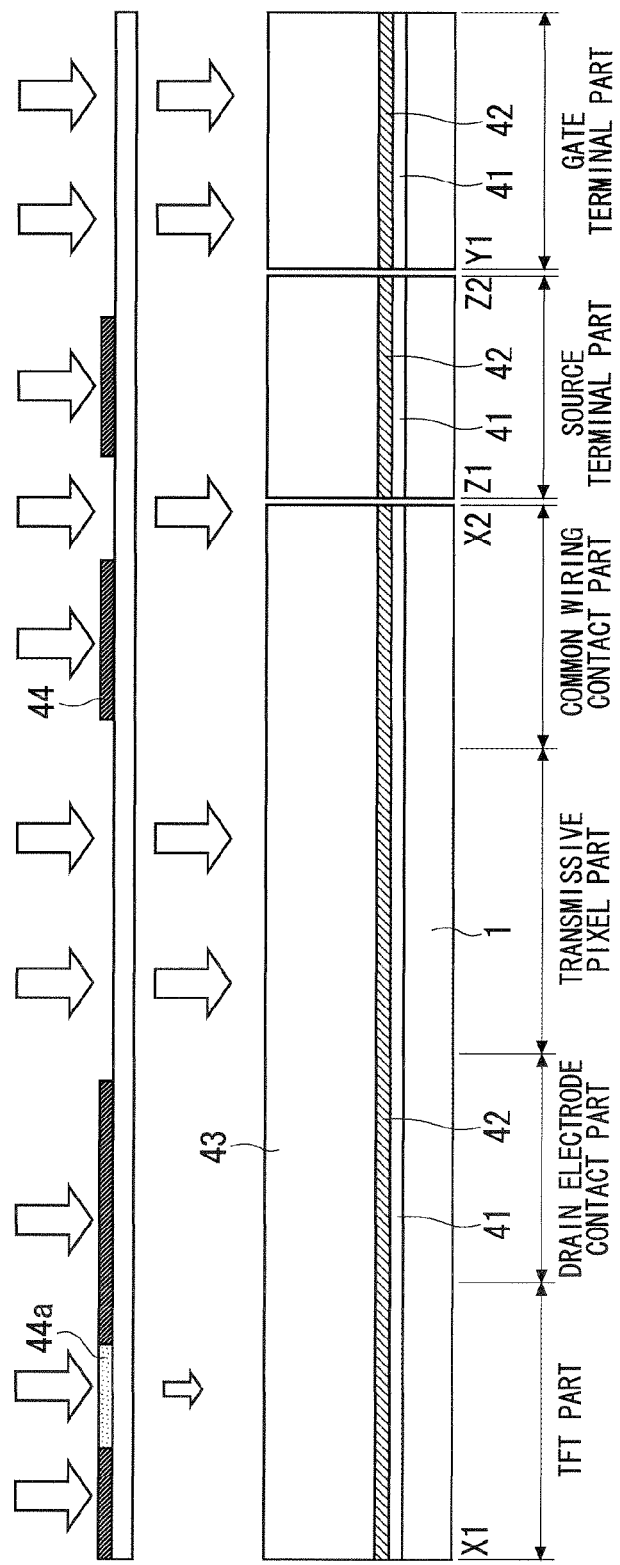
FIGS. 18 to 20 are views each showing a production step of the TFT array substrate according to the third preferred embodiment.

Then, as shown in FIG. 18, a photoresist material composed of a novolac series positive type photosensitive resin is applied onto the oxide semiconductor film 41 and the metal film 42, whereby a photoresist 43 having a thickness of about 1.5 µm is formed. Then, the photoresist 43 is exposed through a previously prepared photomask 44. The photomask 44 has a light blocking film pattern to form patterns of the source electrode 7, the drain electrode 8, the common wiring 3, and the source terminal electrode 19. In addition, the photomask 44 has a semipermeable pattern (halftone mask 44a) provided in a part corresponding to the channel region of the TFT element 50 (between the region of the source electrode 7 and the region of the drain electrode 8).

Figure 19:
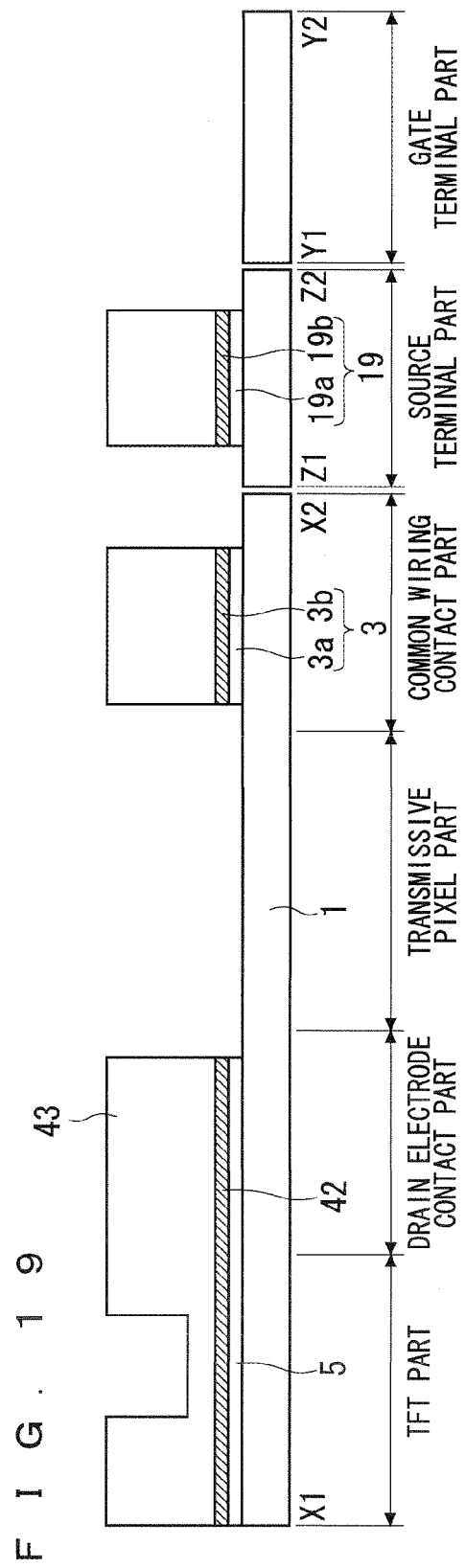

After the photoresist 43 has been exposed through the photomask 44, it is developed with an organic alkali series developing solution containing tetramethylammonium hydroxide (TMAH). Thus, as shown in FIG. 19, the oxide semiconductor film 41 and the metal film 42 are removed except for the parts corresponding to the source electrode 7, the drain electrode 8, the channel region, the common wiring 3, and the source terminal electrode 19. At this time, the photoresist 43 is thinly left in the part corresponding to the channel region exposed through the halftone mask 44a, compared with the unexposed region. According to this preferred embodiment, the thin photoresist 43 having a thickness of about 0.2 µm is left in that part.

Then, the Al alloy film and the MoNb film are etched with a PAN series etching solution (mixed solution of phosphoric acid, nitric acid, and acetic acid). Then, the oxide semiconductor film 41 (In—Zn—Sn—O film) is etched with oxalic acid through the same photoresist 43, and patterned. Thus, the source electrode 7, the drain electrode 8, the semiconductor layer 5, the common wiring 3, and the source terminal electrode 19 are formed. However, at this point, the source electrode 7 and the drain electrode 8 are not separated.

Figure 20:
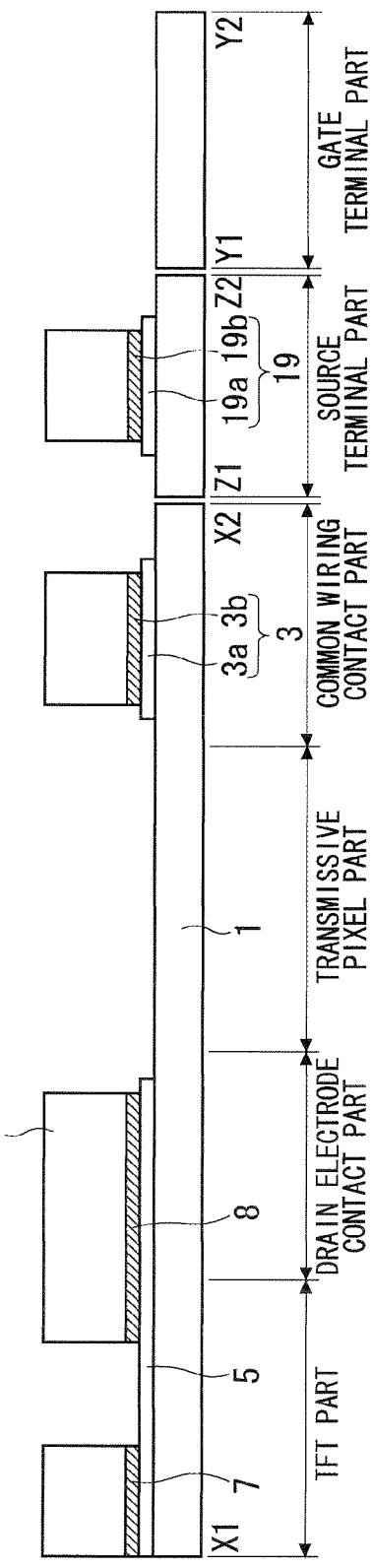

Then, a film thickness of the photoresist 43 is reduced as a whole by $O_2$ ashing, and the photoresist 43 on the channel region of the TFT element 50 is removed. Then, the Mo alloy and the Al alloy on the channel region is etched away again with the mixed solution of phosphoric acid, nitric acid, and acetic acid, whereby the source electrode 7 and the drain electrode 8 are separated. At this time, the Al alloy and the Mo alloy exposed when the resist is retreated due to the ashing is also etched away (FIG. 20). After that, the photoresist 43 is removed.

As described above, the source electrode 7, the drain electrode 8, the semiconductor layer 5, the common wiring 3, and the source terminal electrode 19 can be collectively formed of the same layer material.

Then, a silicon oxide film having a thickness of 250 nm serving as the gate insulating film 4 is formed so as to cover the whole upper surface of the transparent insulting substrate 1, by plasma CVD. The oxide semiconductor is easily reduced by hydrogen, so that there is a possibility that the oxide semiconductor layer 5 is reduced and brought to an oxygen deficient state at this time. When the semiconductor layer 5 is brought to the oxygen deficient state, the problem is that conductivity is increased and an off leakage current of the TFT element 50 is increased. Therefore, it is preferable to use a hydrogen-poor silicon oxide film. Alternatively, a metal insulating film composed of gallium oxide or alumina may be used. According to this preferred embodiment, the silicon oxide film is formed with gas containing $SiH_4$ (silane) and $N_2O$ (nitrogen monoxide) as main components at a temperature of 200° C. When it is formed at 200° C. or a lower temperature, a hydrogen radical which is generated when $SiH_4$ is decomposed is prevented from being thermally diffused to the oxide semiconductor layer 5.

After that, an annealing process is performed at 250° C. to 350° C. in an environment of a mixed gas of oxygen and nitrogen. Plasma damage and the like caused on the channel layer due to the above production process can be repaired by the annealing process. In addition, in addition to the plasma damage, a reduced layer (oxygen deficient layer) is formed when the source electrode 7 and the drain electrode 8 are formed, due to an interface reaction with the oxide semiconductor layer 5. This is generated because metal takes oxygen out of the oxide semiconductor at the time of forming the oxide layer in an interface. The reduced layer causes the conductivity to increase and the off leakage current to increase, but by supplying oxygen through the annealing, the deficient state can be repaired.

Then, by applying a photosensitive organic insulating material, the organic insulating film 10 is formed to form the drain electrode contact hole 31, the common wiring contact hole 32, the gate terminal contact hole 33, and the source terminal contact hole 34, and then the organic insulating film 10 in the region where the TFT element 50 is formed is removed. Then, a transparent conductive film composed of ITO and a metal film composed of Al alloy are used to collectively form the lead-out wiring 11, the gate electrode 2, the common electrode 12, the gate terminal electrode 18, the metal cap film 14. Then, the interlayer insulating film 15 and the lead-out wiring contact hole 35 are formed, and the pixel electrode 16 is formed. The steps after the formation of the organic insulating film 10 are the same as those in the second preferred embodiment, so that their description is omitted.

In addition, according to this preferred embodiment, it is preferable that a SiN film is used for the interlayer insulating film 15, and the TFT element 50 is also covered with it. Since the gate insulating film 4 is the silicon oxide film, it is poor in barrier properties (blocking properties) against an impurity component such as water ($H_2O$), sodium (Na), or potassium (K) which affects the TFT characteristics. Especially, the oxide semiconductor film is easily affected by the impurity. When the SiN film which is superior in barrier properties is provided as the upper layer, the characteristics can be stabilized.

Thus, according to this preferred embodiment, it is possible to produce a TFT array substrate in which contact resistance is stabilized, mobility is high, power consumption is low, and aperture ratio is low, through five photoengraving processes.

The In—Zn—Sn—O target $[IN_2O_3.(ZnO)_6.(SnO_2)_2]$ is used for the oxide semiconductor film in this preferred embodiment, but an In—Ga—Zn—O target $[IN_2O_3.Ga_2O_3.(ZnO)_2]$ having an atomic composition ratio of 1:1:1:4 may be used. In general, In—Ga—Zn—O is soluble not only in the chemical solution containing oxalic acid, but also in the above-described PAN series chemical solution. In this case, an Al alloy is to be used as a single layer for the source and drain electrodes, and etched with an organic alkali series chemical solution. For example, the Al alloy can be etched with an organic alkali series developing solution containing tetramethylammonium hydroxide (TMAH). The In—Ga—Zn—O is resistant to the alkali series chemical solution, so that it can be selectively etched.

In addition, Hf (hafnium) or Zr (zirconium) may be added to the above composition, and an oxide semiconductor whose bandgap is increased may be used. When the bandgap is increased, carriers can be further prevented from being generated by the light, so that the off leakage current of the TFT can be reduced. Therefore, a margin can be provided for the problem such as the display unevenness and crosstalk.

In addition, according to this preferred embodiment, after the source electrode, the drain electrode, the channel region, the common wiring 3, and the source terminal electrode have been collectively formed, the gate insulating film 4 is formed. However, before the gate insulating film 4 is formed, an atmospheric-pressure plasma process, or a plasma process with oxygen series gas such as $N_2O$, or $O_2$ may be performed. In this case, the reduced layer (oxygen deficient layer) formed when the source electrode 7 and the drain electrode 8 are formed can be more effectively repaired. A plasma damage due to this process can be repaired by the annealing process performed later, so that there is no problem.

<Variation>

Figure 21:
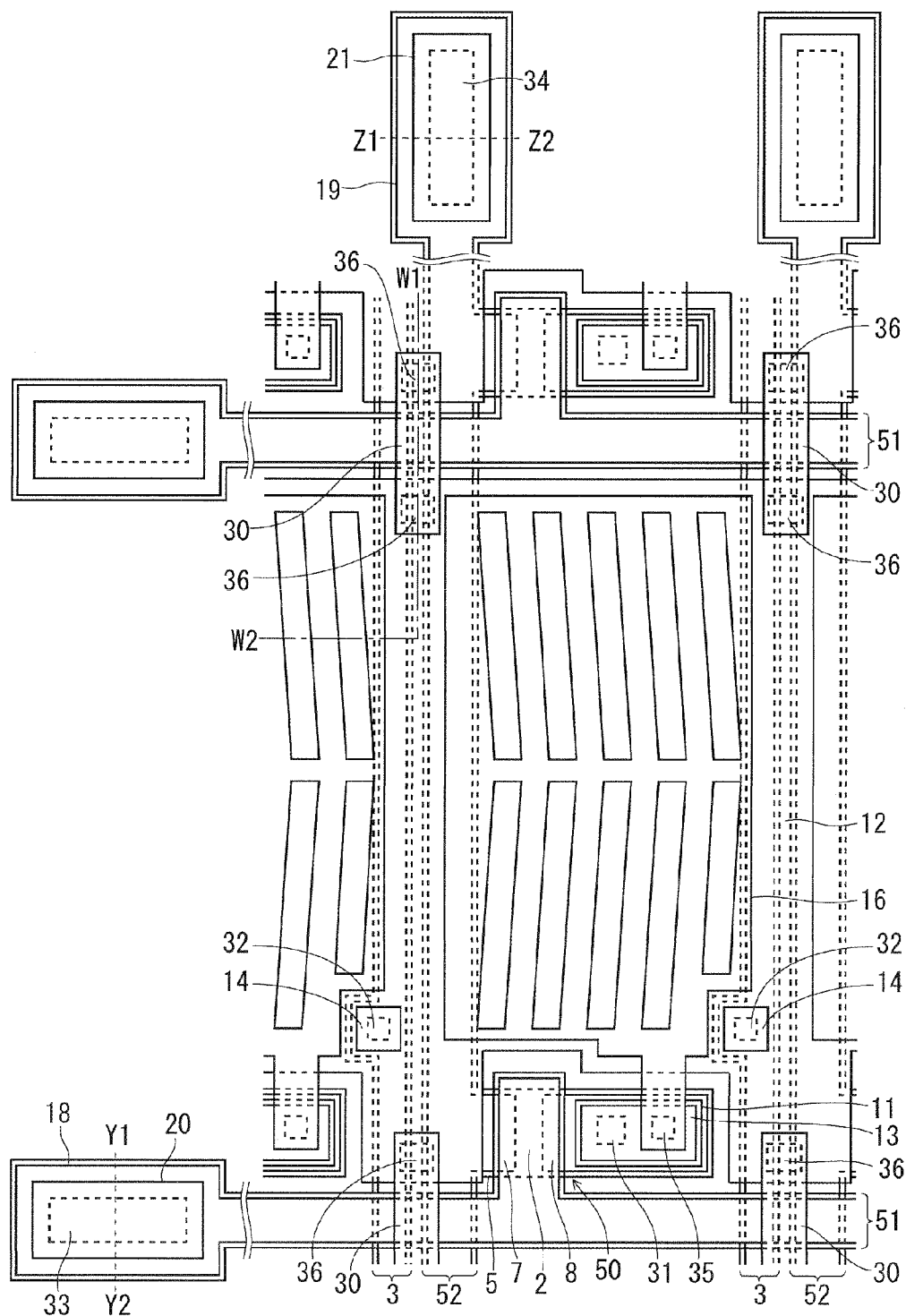
FIG. 21 is a plan view showing a variation of the TFT array substrates according to the second and third preferred embodiments.
Figure 22:
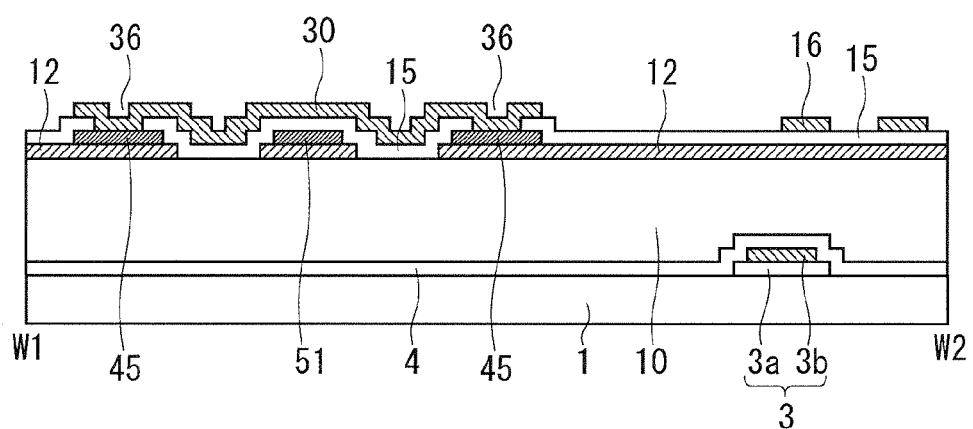
FIG. 22 is a cross-sectional view showing the variation of the TFT array substrates according to the second and third preferred embodiments.

According to the second preferred embodiment (FIG. 6) and the third preferred embodiment (FIG. 16), the common electrode 12 is isolated in each pixel unit, but they may be connected between the adjacent pixels. FIG. 21 is a plan view showing a variation in which the common electrodes 12 are electrically connected to each other between the adjacent pixels. In addition, FIG. 22 is a cross-sectional view taken along a line W1-W2 in FIG. 21.

As shown in FIG. 21, the common electrode 12 is formed so as to stride over the source wiring 52 and the common wiring 3. That is, the common electrode 12 is integrally formed in the adjacent pixels arranged in an extension direction of the gate wiring 51. Even when there is a foreign object in the common wiring contact hole 32, and the common electrode 12 and the common wiring 3 cannot be electrically connected, a common potential is supplied from the common electrode 12 in the adjacent pixel, so that a display defect in the pixel unit can be eliminated.

In addition, as shown in FIG. 21, a bridge wiring 30 is formed so as to stride over the gate wiring 51 to connect the common electrodes 12 in the adjacent pixels. The bridge wiring 30 is formed of the same layer as that of the pixel electrode 16.

The bridge wiring 30 connects the common electrodes 12 in the two adjacent pixels through a contact hole 36 formed in the interlayer insulating film 15. Thus, a potential can be also supplied from the common electrode 12 in the adjacent pixel arranged in an extension direction of the source wiring 52, which is more effective. Especially, when the display device is large, as for a potential supplied from a power supply provided outside a display area, a voltage drop is more likely to be caused in a position closer to a center of the display area. Thus, when this variation is used, the common potential can be uniformly supplied in the display area, so that the display unevenness can be reduced.

In addition, as shown in FIG. 22, it is desirable that a metal cap film 45 is arranged on the common electrode 12 in the position where the contact hole 36 is formed. Thus, the notch can be prevented from being formed in an edge of its bottom when the contact hole 36 is formed.

While the invention has been shown and described in detail, the foregoing description is in all aspects illustrative and not restrictive. It is therefore understood that numerous modifications and variations can be devised without departing from the scope of the invention.

What is claimed is:

1. A TFT array substrate comprising:
 a TFT element;
 a common wiring supplied with a common potential;
 an organic insulating film formed of a photosensitive organic resin material to cover a drain electrode of said TFT element and said common wiring;
 a first contact hole formed in said organic insulating film, and reaching said drain electrode;
 a second contact hole formed in said organic insulating film, and reaching said common wiring;
 a first electrode and a lead-out wiring made of a transparent conductive film and extending on said organic insulating film;
 an interlayer insulating film formed on said first electrode; and
 a second electrode extending above said first electrode through said interlayer insulating film, and connected to said lead-out wiring through a third contact hole formed in said interlayer insulating film, wherein
 one of said first electrode and said lead-out wiring is connected to said drain electrode through said first contact hole,
 the other of said first electrode and said lead-out wiring is connected to said common wiring through said second contact hole,
 a metal cap film is formed directly on each of said first electrode and said lead-out wiring in said first contact hole and said second contact hole on respective sides facing away from said drain electrode and said common wiring, and
 said metal cap film is located so as to contact respective surfaces of said first electrode and said lead-out wiring all over a formation region of said metal cap film.

2. The TFT array substrate according to claim 1, wherein said metal cap film on said lead-out wiring is also formed on a bottom of said third contact hole.

3. The TFT array substrate according to claim 2, wherein said cap film on the bottom of said third contact hole has an opening smaller than an inner diameter of the bottom of said third contact hole.

* * * * *